United States Patent
Nemetz et al.

[11] Patent Number: 5,923,191
[45] Date of Patent: Jul. 13, 1999

[54] DEVICE AND A METHOD FOR MONITORING A SYSTEM CLOCK SIGNAL

[75] Inventors: Stephen David Nemetz, Gilbert; Mark Leonard Buer, Chandler, both of Ariz.

[73] Assignee: VLSI Technology, Inc., San Jose, Calif.

[21] Appl. No.: 08/853,355

[22] Filed: May 8, 1997

[51] Int. Cl.$^6$ .................................................. H03K 5/19
[52] U.S. Cl. ............................... 327/20; 327/21; 327/3; 327/18; 327/38; 327/31; 377/69
[58] Field of Search .................................. 327/38, 18, 26, 327/27, 31, 34, 551, 141, 20, 21, 1, 37, 42, 39, 3; 377/69

[56] References Cited

U.S. PATENT DOCUMENTS

| | | | |
|---|---|---|---|
| 3,558,911 | 1/1971 | Chen | 303/129 |
| 3,784,758 | 1/1974 | McIntosh et al. | 327/46 |
| 4,392,226 | 7/1983 | Cook | 327/31 |
| 4,399,412 | 8/1983 | Rinaldi | 327/38 |
| 4,465,977 | 8/1984 | Lopez De Romana | 377/69 |
| 4,612,546 | 9/1986 | Rosen | 342/16 |
| 4,787,097 | 11/1988 | Rizzo | 327/156 |
| 4,866,771 | 9/1989 | Bain | 375/200 |
| 4,998,203 | 3/1991 | DiGiulio et al. | 371/62 |
| 5,175,751 | 12/1992 | Heaney et al. | 327/18 |
| 5,404,402 | 4/1995 | Sprunk | 380/4 |
| 5,406,519 | 4/1995 | Ha | 395/195 |
| 5,421,006 | 5/1995 | Jablon et al. | 395/183.12 |
| 5,434,397 | 7/1995 | Diehl et al. | 371/62 |
| 5,479,420 | 12/1995 | Hong et al. | 371/64 |

*Primary Examiner*—Dinh Le
*Attorney, Agent, or Firm*—Woodard, Emhardt, Naughton, Moriarty & McNett

[57] ABSTRACT

A system clock signal monitor that monitors a system clock signal by comparing a pulse width of a logic high pulse and a pulse width of a logic low pulse of each system clock duty cycle of the system clock signal to one or more reference clock duty cycles in order to detect any pulse width violations. For each system clock duty cycle, a pulse width violation is detected if the pulse width of a logic high pulse and/or the pulse width of a logic low pulse is equal to or greater than a maximum time interval for the logic high pulse and the logic low pulse. A pulse width violation may also occur if the pulse width of a logic high pulse and/or the pulse width of a logic low pulse is within a risk range (as defined by the system designer) of the maximum time interval for the logic high pulse and the logic low pulse. The system clock signal monitor can be further designed to warn/reset a processor or a user of the processor upon the detection of one or more detected occurrences of a pulse width violation.

37 Claims, 23 Drawing Sheets

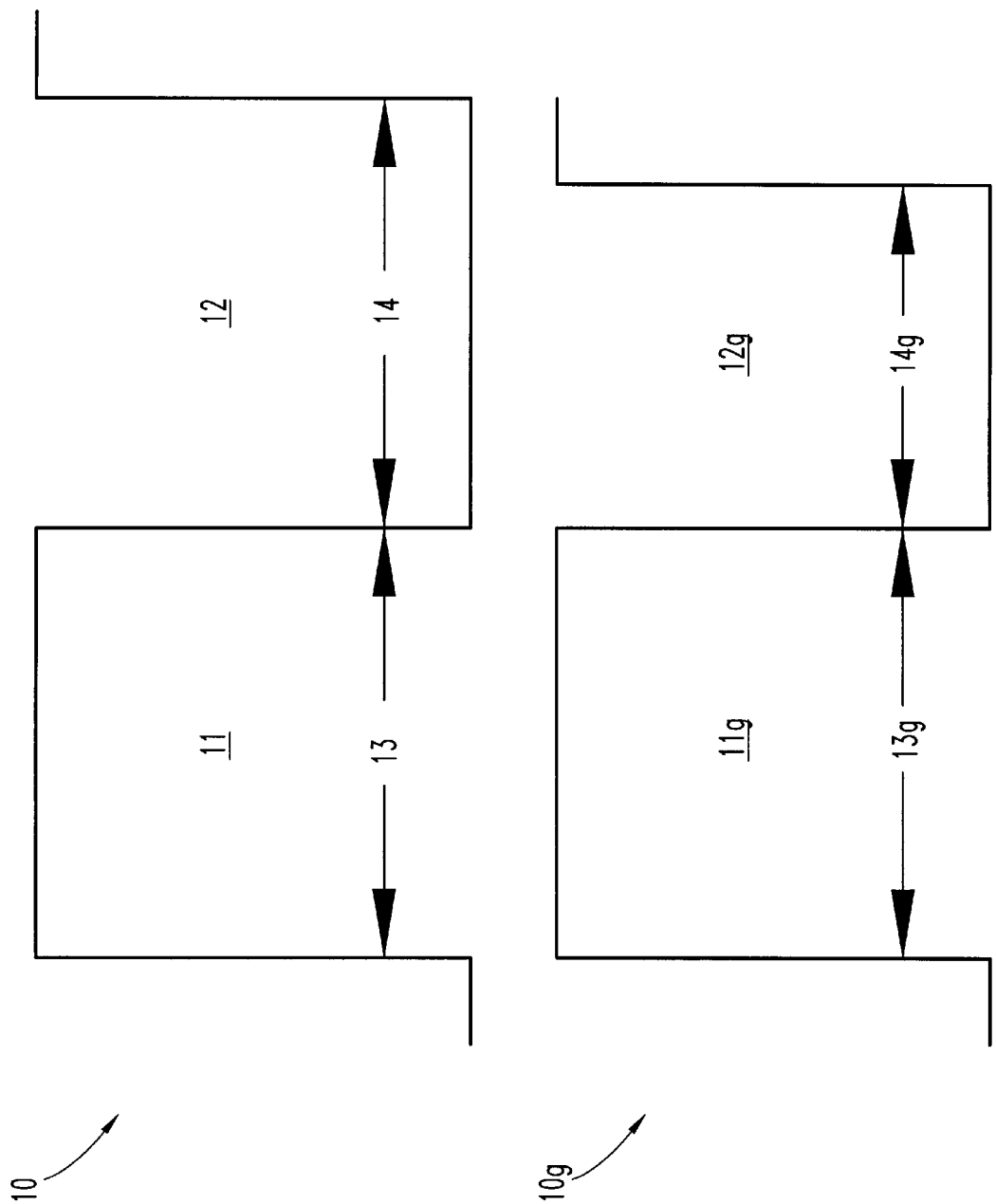

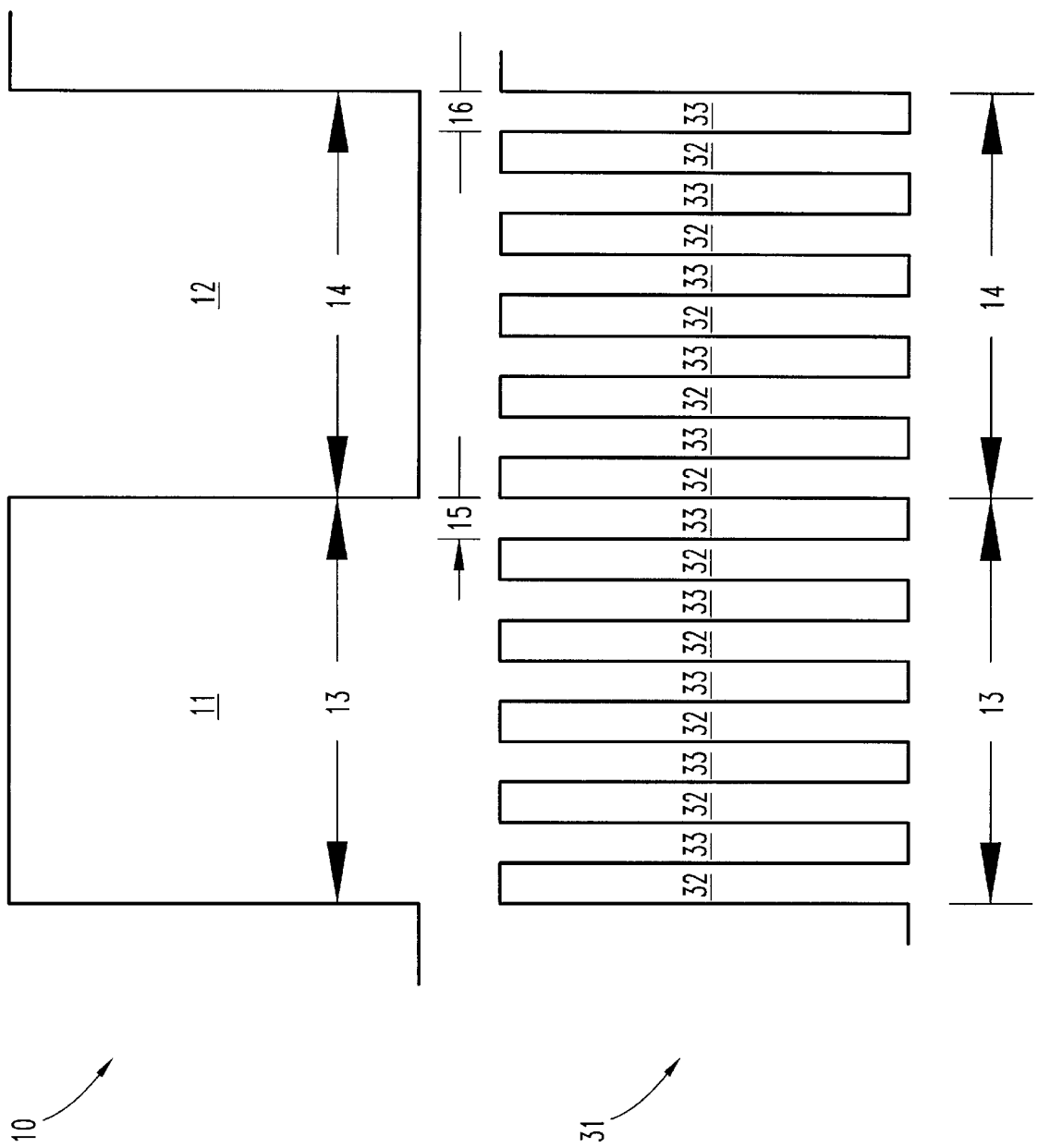

DEVICE AND A METHOD FOR MONITORING A SYSTEM CLOCK SIGNAL

BACKGROUND OF THE INVENTION

The present invention generally relates to a device and a method for monitoring an operating frequency of a system clock signal, and more specifically, to a device and a method for monitoring a pulse width of each logic pulse of a system clock duty cycle.

The basic components of a computer are a system clock, a central processing unit, an input-output unit, a memory unit and a bus structure. The system clock generates a system clock signal that is received by the various units of the computer. In response to the system clock signal, the units of the computer input information from the bus structure as well as output information to the bus structure. This information is representative of either data, an instruction, or an address. Therefore, it is essential that the integrity of the information is maintained at all times.

A system clock signal that is generated at a non-operable frequency, i.e. any frequency that is faster than the longest reactive delay of any unit of the computer, causes internal timing problems that will effect the integrity of the information. Conversely, a system clock signal that is generated at an operating frequency, i.e. any frequency that is slower than the longest reactive delay of any unit of the computer, does not cause any internal timing problems that will effect the integrity of the information. Consequently, the system clock is typically intended to generate the system clock signal at an operating frequency that yields high performance for the computer.

Unfortunately, the system clock signal may be vulnerable to manipulation by an outside source. This manipulation involves decreasing the system clock signal to or below an operating frequency that enables data to be extracted from the computer. Such data extraction is not desirable when the information represents a trade secret, a confidential business plan, a classified military strategy, a private financial portfolio, or the like. In addition, manipulation of the system clock signal may yield unpredictable results during digital communications (modem), frequency modulations, phase modulations and frequency syntheses, especially if the system clock signal is inputted into a phase-locked loop. Such unpredictable results effect the integrity of the information.

For each computer, there exists a minimum operating frequency for the system clock signal that will ensure that data cannot be extracted from computer and that unpredictable results do not occur within the computer. What is therefore needed is a device and a method that can monitor the system clock signal in order to detect when the signal clock signal is being generated at an operating frequency that is equal to or slower than the minimum operating frequency for the system clock signal. What is also needed is a device and a method that can monitor the system clock signal in order to detect when the system clock signal is at risk of being generated at an operating frequency that is equal to or slower than the minimum operating frequency for the system clock signal.

SUMMARY OF THE INVENTION

The present invention relates to a device and a method for monitoring a pulse width of each logic pulse of a system clock duty cycle. Various aspects of the present invention are novel, non-obvious, and provide various advantages. While the actual nature of the present invention described in detail herein can only be determined with reference to the claims appended hereto, certain features which are characteristic of the present invention disclosed herein can be described briefly.

In accordance with a first aspect of the present invention, a device for monitoring a plurality of system clock duty cycles, each system clock duty cycle having a logic high pulse and a logic low pulse, comprises a reference clock and a pulse width detector. The reference clock is configured to generate a plurality of reference clock duty cycles. The pulse width detector is operatively coupled to the reference clock to receive the reference clock duty cycles and is adapted to receive the system clock duty cycles. The pulse width detector is configured to compare at least one received reference clock duty cycle to a logic high pulse of a received system clock duty cycle and at least one received reference clock duty cycle to a logic low pulse of a received system clock duty cycle in order to detect each occurrence of a pulse width violation.

In accordance with a second aspect of the present invention, a system comprises a system clock, a reference clock, and a pulse width detector. The system clock generates a plurality of system clock duty cycles, each system clock duty cycle having a logic high pulse and a logic low pulse. The reference clock generates a plurality of reference clock duty cycles. The pulse width detector is operatively coupled to the system clock to receive the system clock duty cycles, and is operatively coupled to the reference clock to receive the reference clock duty cycles. The pulse width detector is configured to compare at least one received reference clock duty cycle to a logic high pulse of a received system clock duty cycle and at least one received reference clock duty cycle to a logic low pulse of a received system clock duty cycle in order to detect each occurrence of a pulse width violation.

In a third aspect of the present invention, a method for monitoring a plurality of system clock duty cycles, each system clock duty cycle including a logic high pulse and a logic low pulse, comprises generating a plurality of reference clock duty cycles and the step of comparing at least one reference clock duty cycle to the logic high pulse of each system clock duty cycle and comparing at least one reference clock duty cycle to the logic low pulse of each system clock duty cycle in order to detect each occurrence of a pulse width violation.

It is an object of the present invention to provide a device and a method for protecting information being processed by warning a processor and/or a user of a computer upon the detection of a system clock signal pulsing for one or more duty cycles at an operating frequency that is equal to or slower than a minimum operating frequency for the system clock signal.

It is another object of the present invention to provide a device and a method for protecting information being processed by warning a processor and/or a user of a computer upon the detection of a system clock signal at risk of pulsing for one or more duty cycles at an operating frequency that is equal to or slower than a minimum operating frequency for the system clock signal.

It is another object of the present invention to provide a device and a method for protecting information being processed by dynamically resetting a processor upon the detection of a system clock signal pulsing for one or more duty cycles at an operating frequency that is equal to or slower than a minimum operating frequency for the system clock signal.

It is another object of the present invention to provide a device and a method for protecting information being processed by dynamically resetting a processor upon the detection of a system clock signal at risk of pulsing for one or more duty cycles at an operating frequency that is equal to or slower than a minimum operating frequency for the system clock signal.

These and other objects as well as advantages of the present invention will become more apparent from the following description of the preferred embodiments.

BRIEF DESCRIPTION OF THE DRAWINGS

FIG. 2G is an illustration of an eighth type of pulse width violation.

FIG. 5C is an illustration of a reference clock signal corresponding to the preferred embodiments of the logic high pulse comparator in FIG. 5A and the logic low pulse comparator in FIG. 5B.

DESCRIPTION OF THE PREFERRED EMBODIMENTS

Figure 1:
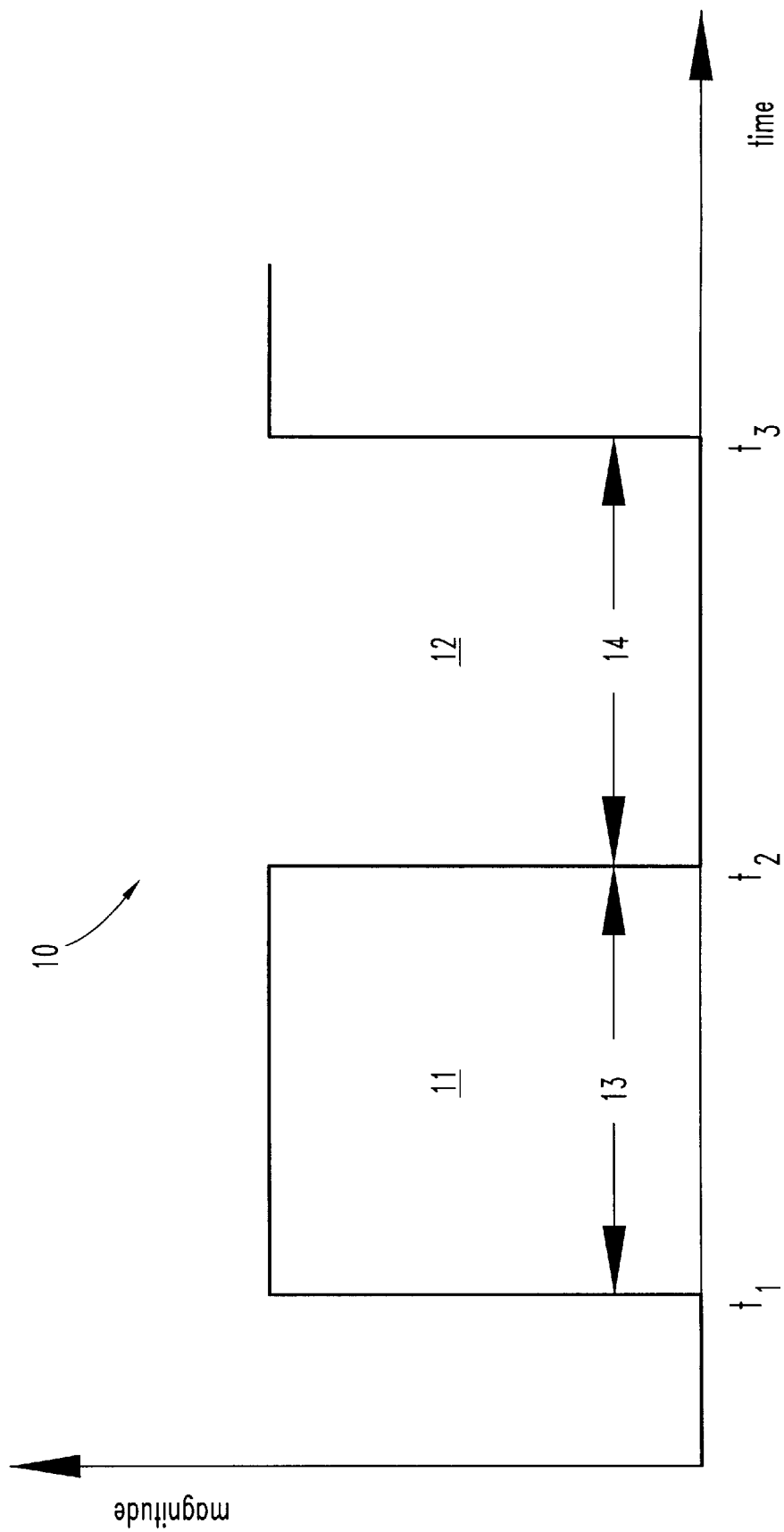
FIG. 1 is an illustration of a system clock duty cycle.

For the purposes of promoting an understanding of the principles of the present invention, reference will now be made to the embodiments illustrated in the drawings and specific language will be used to describe the same. It will nevertheless be understood that no limitation of the scope of the present invention is thereby intended, such alterations and further modifications in the illustrated embodiments, and such further applications of the principles of the present invention as illustrated therein being contemplated as would normally occur to one skilled in the art to which the present invention relates.

FIG. 1 is an illustration of a system clock duty cycle 10 of a system clock signal having a logic high pulse 11 and a logic low pulse 12. Referring to FIG. 1, logic high pulse 11 has a pulse width 13 that extends over time interval $t_2-t_1$ and logic low pulse 12 has a pulse width 14 that extends over time interval $t_3-t_2$. System clock duty cycle 10 is designed as a 50% duty cycle, i.e. pulse width 13 and pulse width 14 represent equal time intervals. It is to be appreciated and understood that the system clock signal comprises a plurality of system clock duty cycles 10, and that a system clock signal is intended to generate each system clock duty cycle 10 in a steady uninterrupted rhythm. Accordingly, for each system clock duty cycle 10, pulse width 13 and pulse width 14 collectively represent the designed operating frequency for the system clock duty cycle 10.

The present invention will now be described herein in reference to FIG. 1. In particular, pulse width 13 and pulse width 14 collectively represent the minimum operating frequency of each system clock duty cycle 10 that is necessary to protect information from extraction and unpredictable results. Further, corresponding to the minimum operating frequency, pulse width 13 represents the maximum time interval for each logic high pulse 11 and pulse width 14 represents the maximum time interval for each logic low pulse 12. The present invention is directed to monitoring each system clock duty cycle 10 to detect when one or more system clock duty cycles 10 are being generated at an operating frequency that is equal to or slower than the minimum operating frequency, or is at risk of being generated at an operating frequency that is equal to or slower than the minimum operating frequency. To this end, the present invention can detect any and all occurrences of a pulse width violation. For purposes of the present invention, a pulse width violation is defined as a system clock duty cycle 10 including: (1) a logic high pulse 11 having a pulse width 13 that is either equal to or greater than the maximum time interval; (2) a logic high pulse 11 having a pulse width 13 that is within a risk range of the maximum time interval; (3) a logic low pulse 12 having a pulse width 14 that is either equal to or greater than the maximum time interval; (4) a logic low pulse 12 having a pulse width 14 that is within a risk range of the maximum time interval; or (5) any combination of (1)–(4).

Figure 2A:
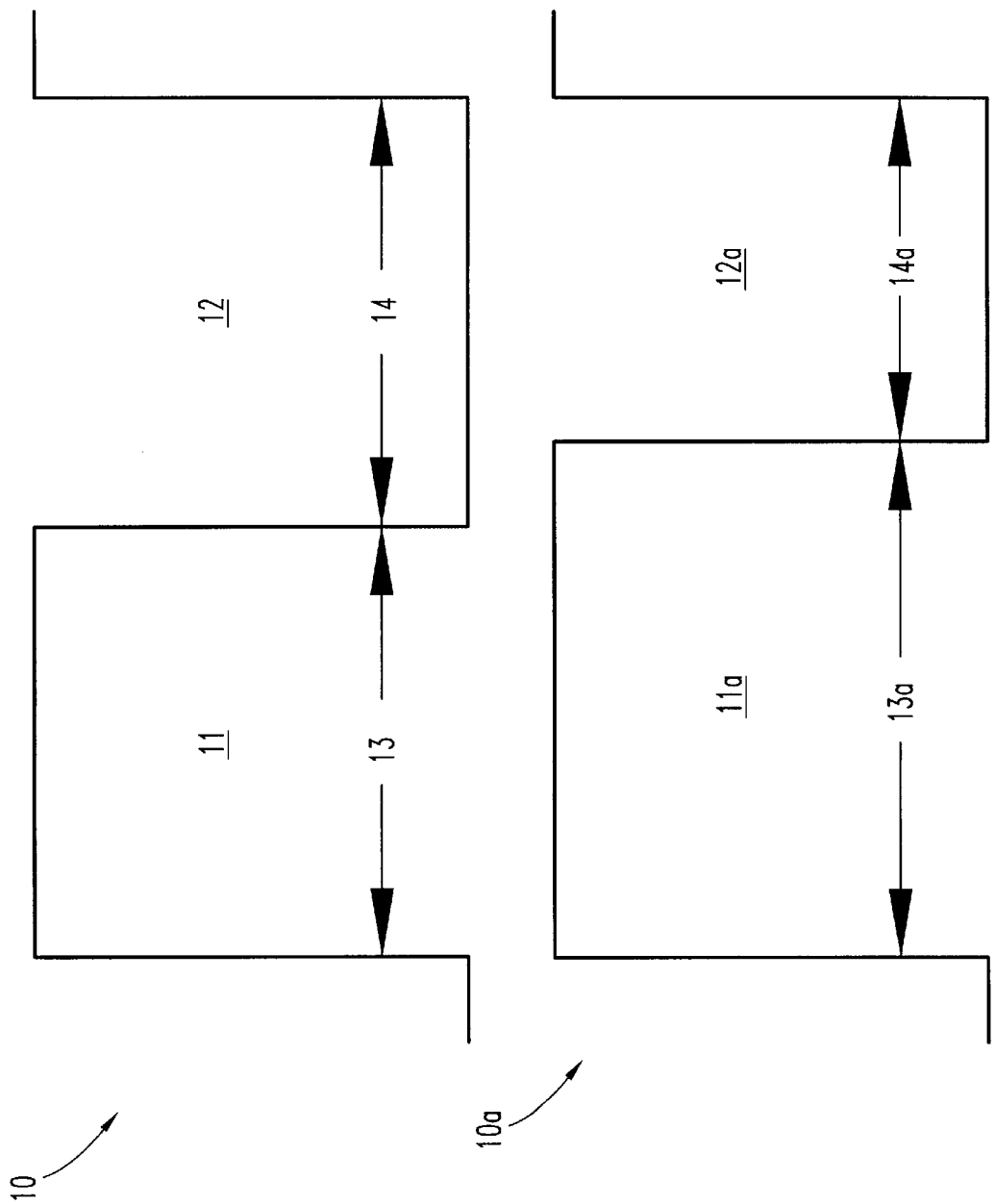
FIG. 2A is an illustration of a second type of pulse width violation.
Figure 2B:
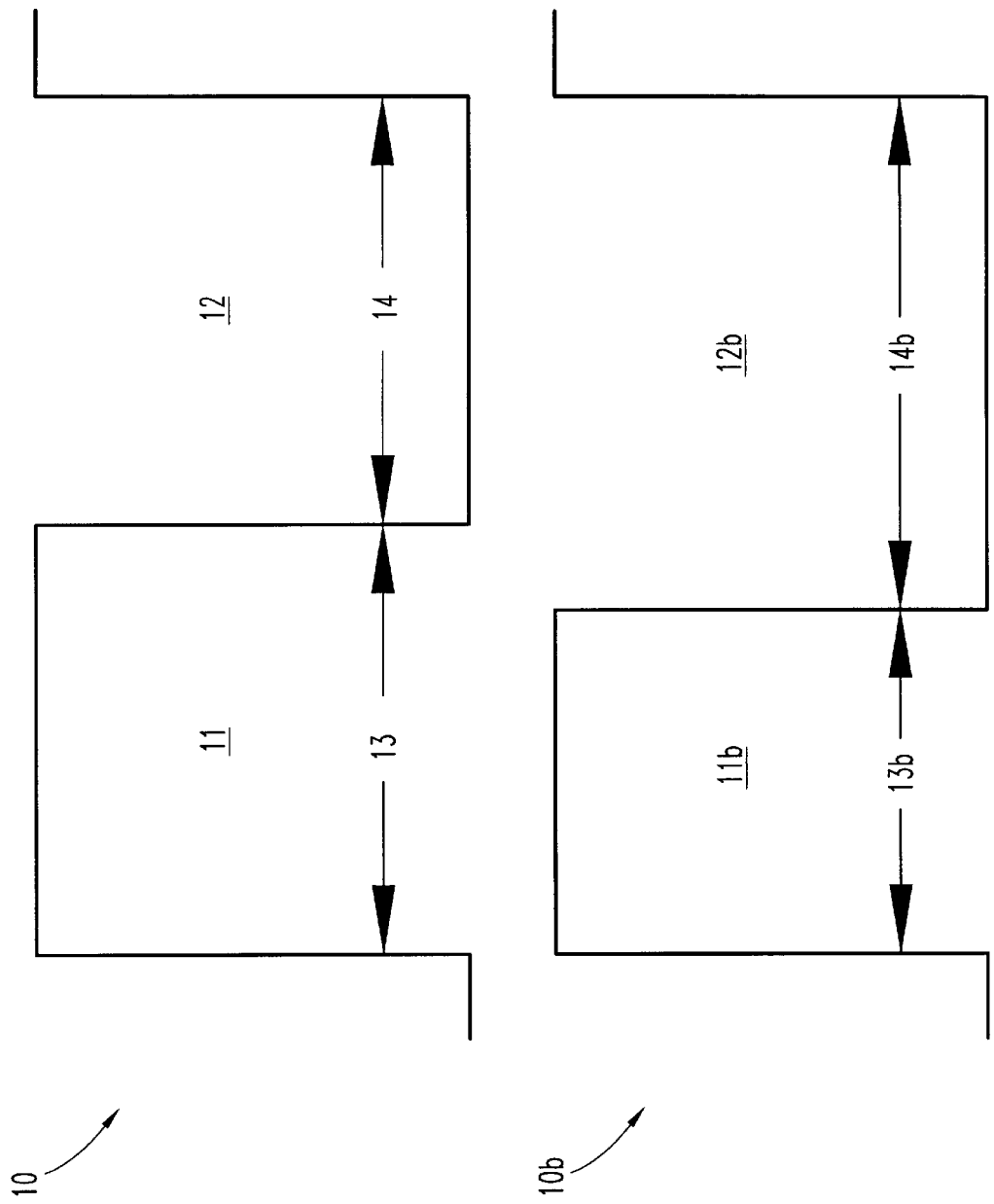
FIG. 2B is an illustration of a third type of pulse width violation.

Referring still to FIG. 1, it is to be appreciated and understood that logic high pulse 11 and logic low pulse 12 as illustrated represent a first type of pulse width violation where both pulse width 13 and pulse width 14 are equal to the maximum time interval, and the operating frequency of system clock duty cycle 10 is equal to the minimum operating frequency. FIG. 2A is an illustration of a second type of pulse width violation. Referring to FIG. 2A, a system clock duty cycle 10a includes a logic high pulse 11a having a pulse width 13a that is greater than pulse width 13, and a logic low pulse 12a having a pulse width 14a that is less than pulse width 14. FIG. 2B is an illustration of a third type of pulse width violation. Referring to FIG. 2B, a system clock duty cycle 10b includes a logic high pulse 11b having a pulse width 13b that is less than pulse width 13, and a logic low pulse 12b having a pulse width 14b that is greater than pulse width 14. It is to be appreciated and understood that the second and third types of pulse width violations as illustrated are examples of non-50% system clock duty cycles 10a and 10b, respectively, that have operating frequencies equal to the minimum operating frequency for system clock duty cycle 10.

Figure 2C:
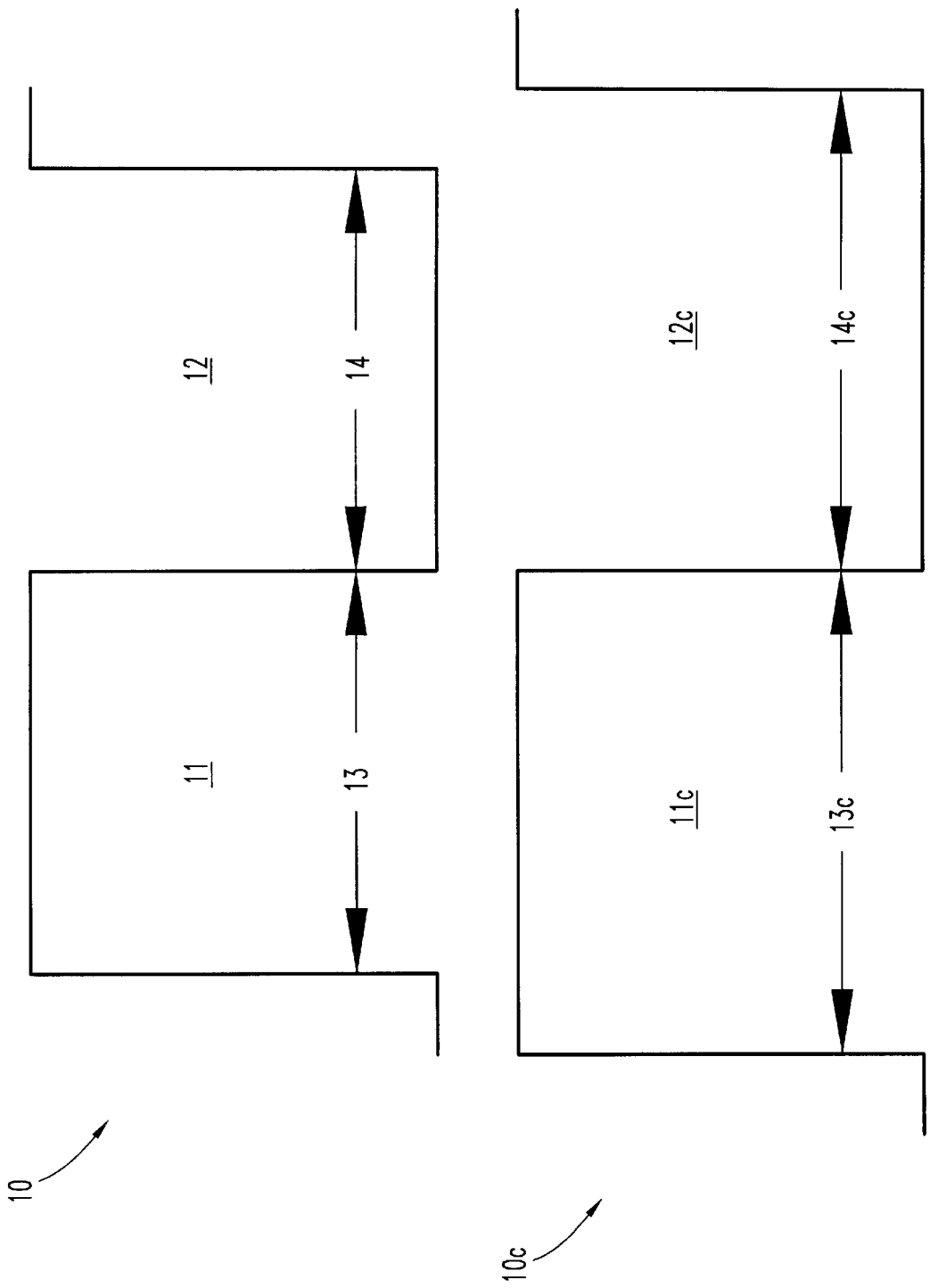
FIG. 2C is an illustration of a fourth type of pulse width violation.

FIG. 2C is an illustration of a fourth type of pulse width violation. Referring to FIG. 2C, a system clock duty cycle 10c includes a logic high pulse 11c having a pulse width 13c that is greater than pulse width 13, and a logic low pulse 12c having a pulse width 14c that is greater than pulse width 14. It is to be appreciated and understood that the fourth type of pulse width violation as illustrated is an example of a 50% system clock duty cycle 10c that has an operating frequency that is slower than the minimum operating frequency for system clock duty cycle 10.

Figure 2D:
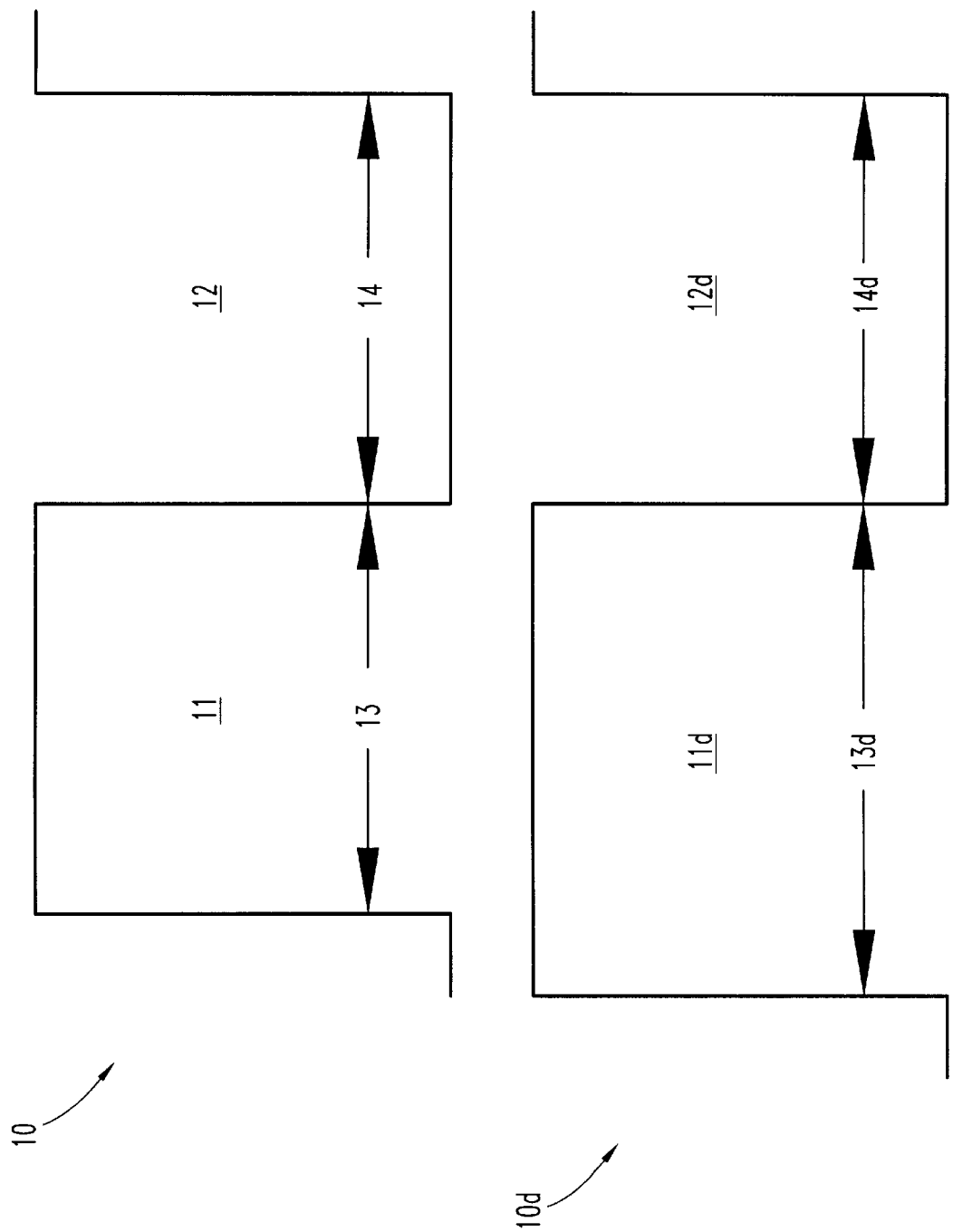
FIG. 2D is an illustration of a fifth type of pulse width violation.
Figure 2E:
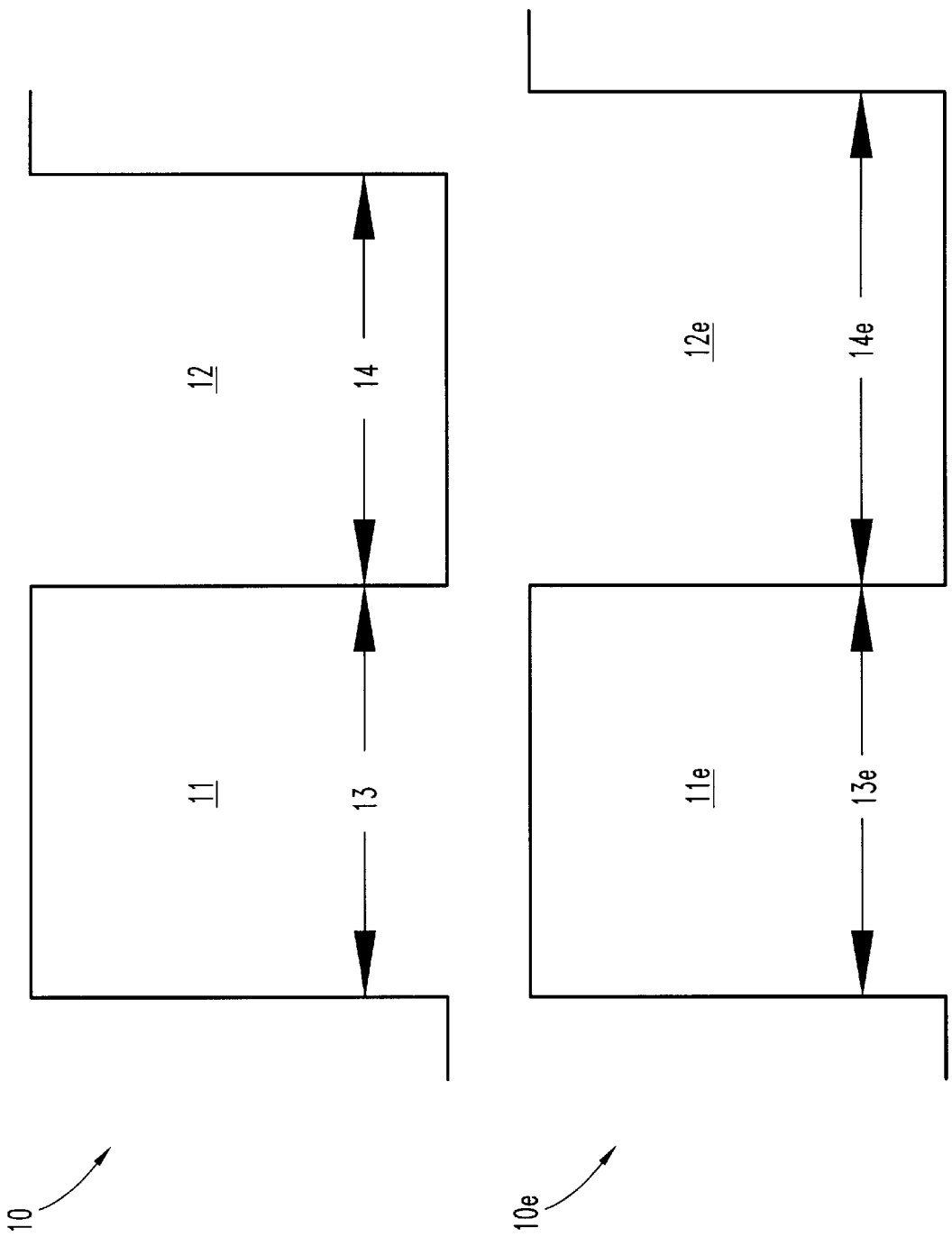
FIG. 2E is an illustration of a sixth type of pulse width violation.

FIG. 2D is an illustration of a fifth type of pulse width violation. Referring to FIG. 2D, a system clock duty cycle 10d includes a logic high pulse 11d having a pulse width 13d that is greater than pulse width 13, and a logic low pulse 12d having a pulse width 14d that is equal to pulse width 14. FIG. 2E is an illustration of a sixth type of pulse width violation. Referring to FIG. 2E, a system clock duty cycle 10e includes a logic high pulse 11e having a pulse width 13e that is equal to pulse width 13, and a logic low pulse 12e having a pulse width 14e that is greater than pulse width 14. It is to be appreciated and understood that the fifth and sixth types of pulse width violations as illustrated are examples of non-50% system clock duty cycles 10d and 10e, respectively, generated at an operating frequency that is slower than the minimum operating frequency for system clock duty cycle 10.

Figure 2F:
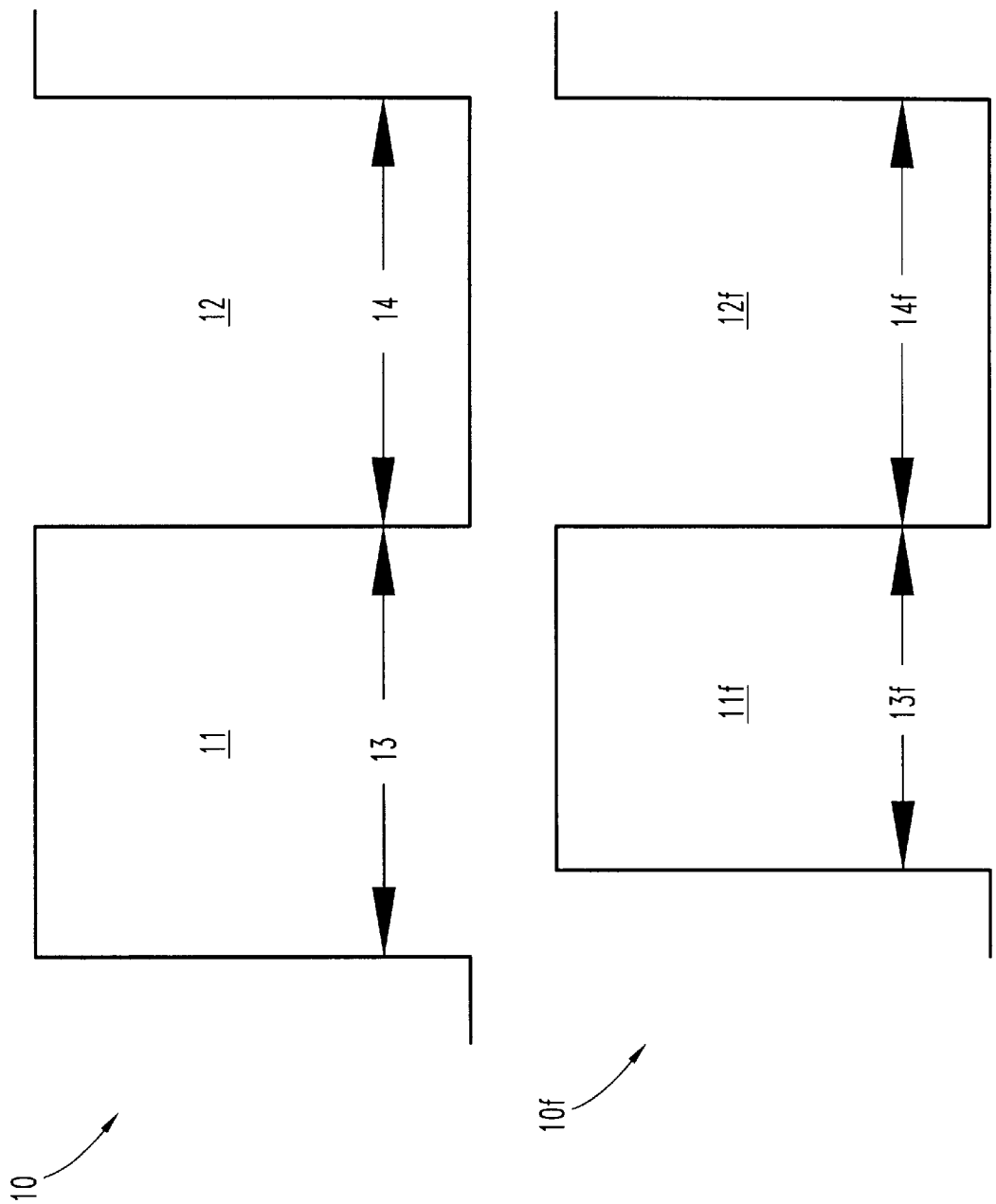
FIG. 2F is an illustration of a seventh type of pulse width violation.

FIG. 2F is an illustration of a seventh type of pulse width violation. Referring to FIG. 2F, a system clock duty cycle 10f includes a logic high pulse 11f having a pulse width 13f that is less than pulse width 13, and a logic low pulse 12f having a pulse width 14f that is equal to pulse width 14. FIG. 2G is an illustration of an eighth type of pulse width violation. Referring to FIG. 2G, a system clock duty cycle 10g includes a logic high pulse 11g having a pulse width 13g that is equal to pulse width 13, and a logic low pulse 12g having a pulse width 14g that is less than pulse width 14. It is to be appreciated and understood that the seventh and eighth type of pulse width violations as illustrated are examples of non-50% system clock duty cycles 10f and 10g, respectively, that are generated at an operating frequency that is faster than the minimum operating frequency, but represents a potential risk of subsequent system clock duty cycles 10 being generated at an operating frequency that is equal to or slower than the minimum operating frequency.

Figure 2H:
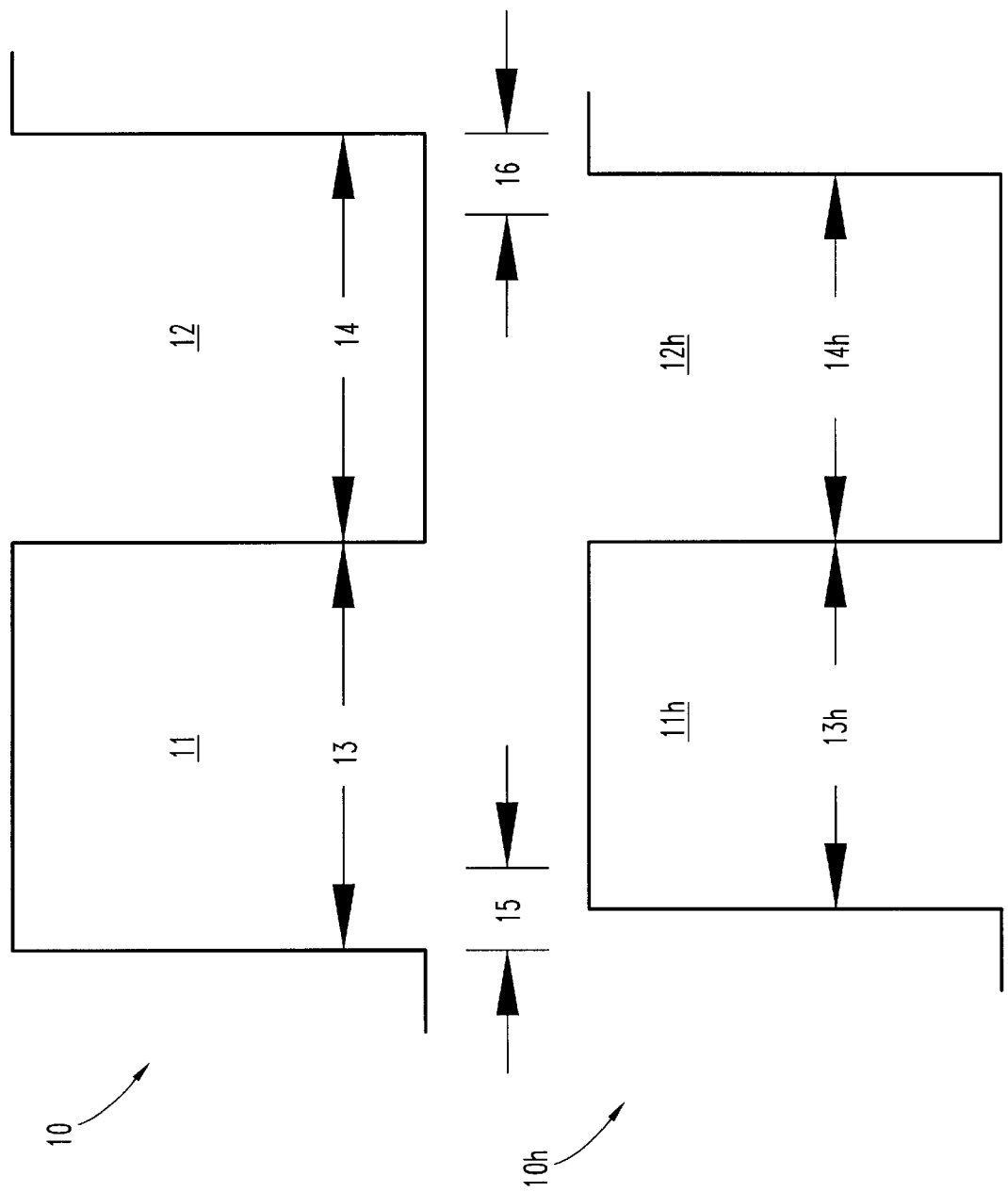
FIG. 2H is an illustration of a ninth type of pulse width violation.

For purposes of the present invention, a risk range is defined as a range of pulse widths that are less than the maximum time interval, but nonetheless, in the opinion of the designer of the computer, represent a potential risk that subsequent pulse widths may be equal to or greater than the maximum time interval. FIG. 2H is an illustration of a ninth type of pulse width violation. Referring to FIG. 2H, a system clock duty cycle 10h includes a logic high pulse 11h having a pulse width 13h that is within a risk range 15 of pulse width 13, and a logic low pulse 12h having a pulse width 14h that is within a risk range 16 of pulse width 14. It is to be appreciated and understood that the ninth type of pulse width violation as illustrated is an example of a 50% system clock duty cycle 10h that has an operating frequency that is faster than the minimum operating frequency for system clock duty cycles 10, but represents a potential risk in the opinion of a designer of the computer that subsequent system clock duty cycles 10 will be generated at an operating frequency that is equal to or slower than the minimum operating frequency.

Figure 2I:
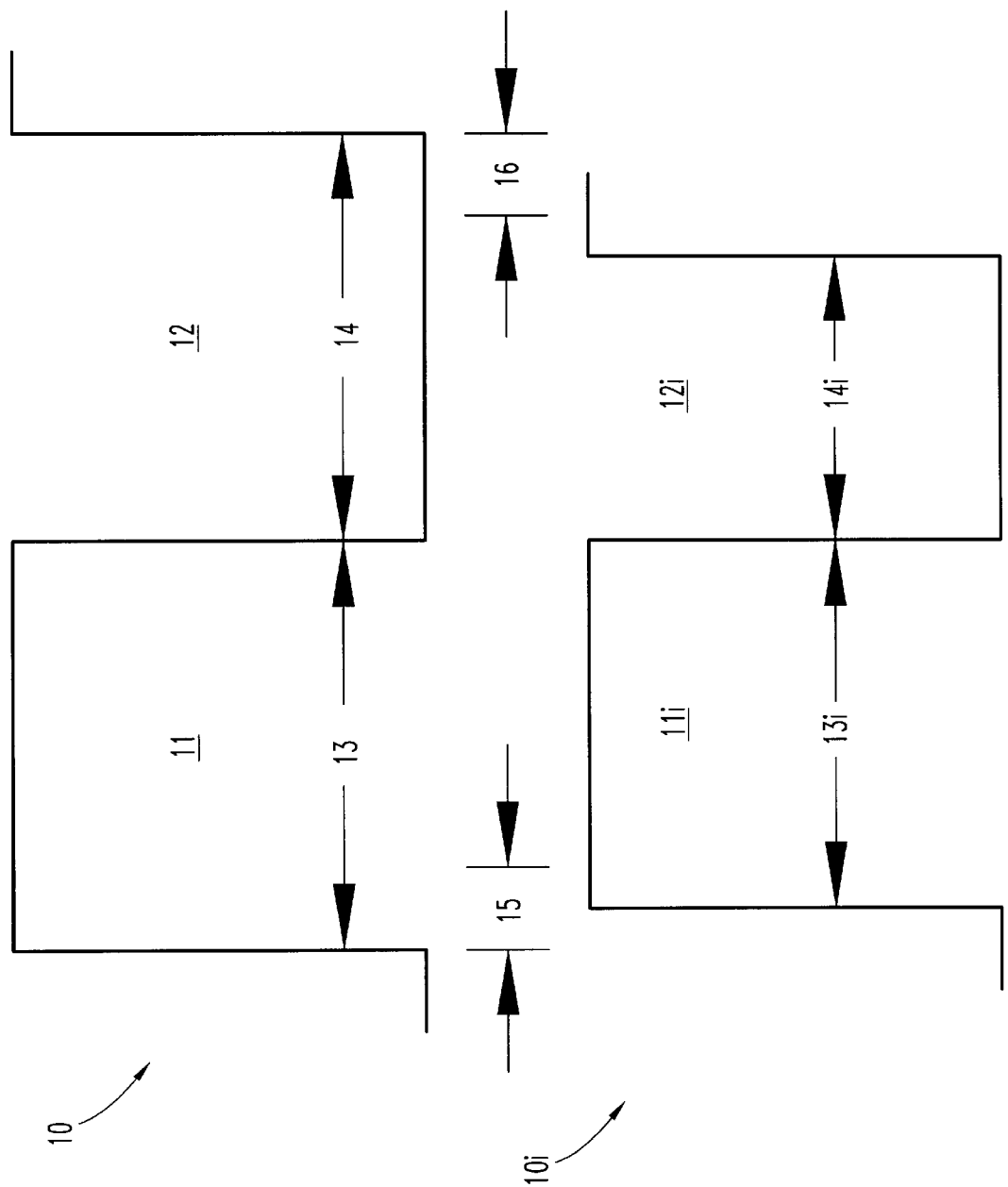
FIG. 2I is an illustration of a tenth type of pulse width violation.
Figure 2J:
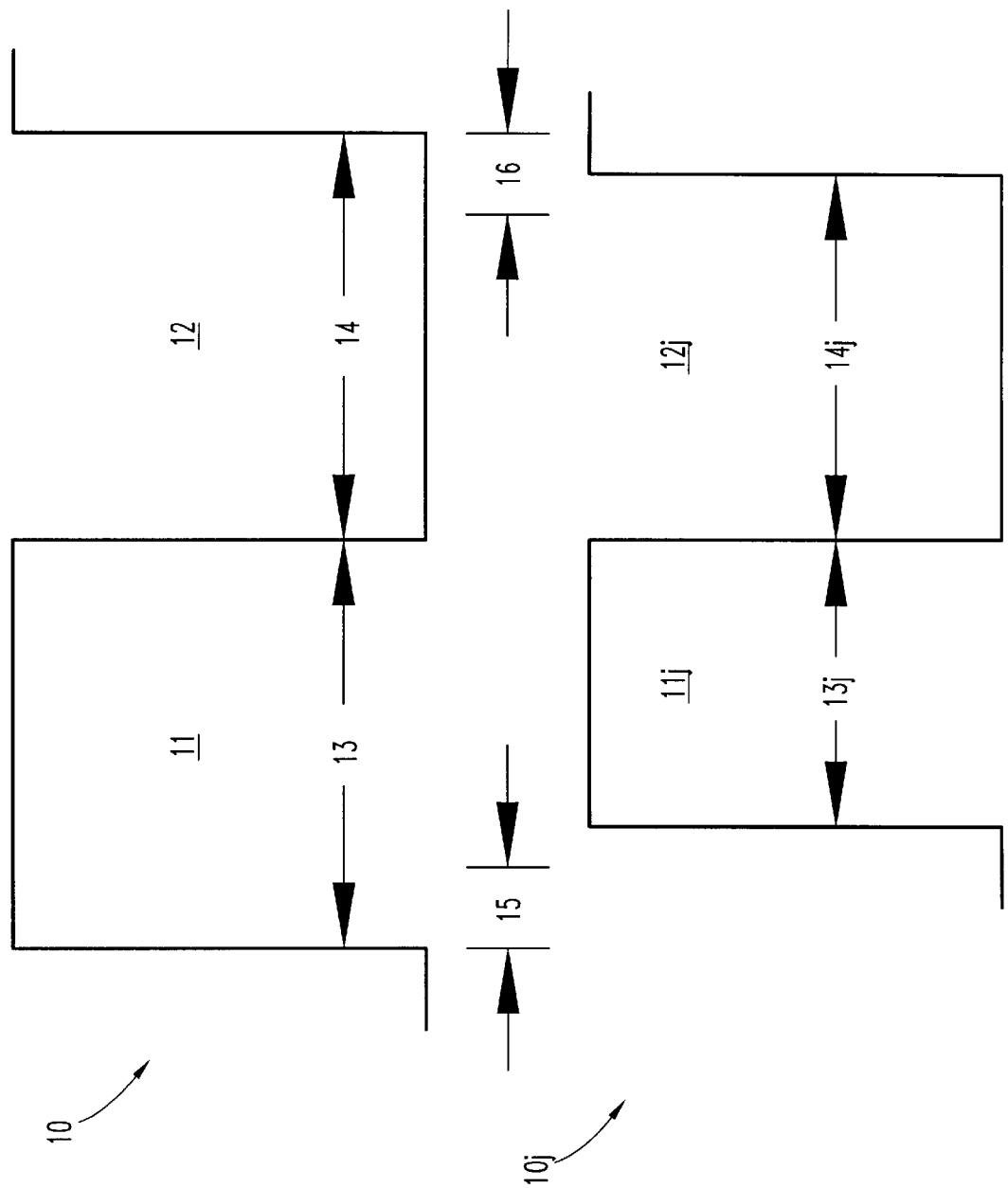
FIG. 2J is an illustration of an eleventh type of pulse width violation.

FIG. 2I is an illustration of a tenth type of pulse width violation. Referring to FIG. 2I, a system clock duty cycle 10i includes a logic high pulse 11i having a pulse width 13i that is within risk range 15, and a logic low pulse 12i having a pulse width 14i that is not within risk range 16. FIG. 2J is an illustration of an eleventh type of pulse width violation. Referring to FIG. 2J, a system clock duty cycle 10j includes a logic high pulse 11j having a pulse width 13j that is not within risk range 15, and a logic low pulse 12j having a pulse width 14j that is within risk range 16. It is to be appreciated and understood that the tenth and eleventh types of pulse width violations as illustrated is an example of non-50% system clock duty cycles 10i and 10j, respectively, that have an operating frequency that is faster than the minimum operating frequency, but represent a potential risk in the opinion of a designer of the computer that subsequent system clock duty cycles 10 will be generated at an operating frequency that is equal to or slower than the minimum operating frequency.

FIGS. 1 and 2A–2J are illustrative of the basic types of pulse width violations. It is to appreciated and understood that there are additional types of pulse width violations that are hybrids of the illustrated basic types of pulse width violations. The preferred embodiments of the present invention will now be described herein.

Figure 3:
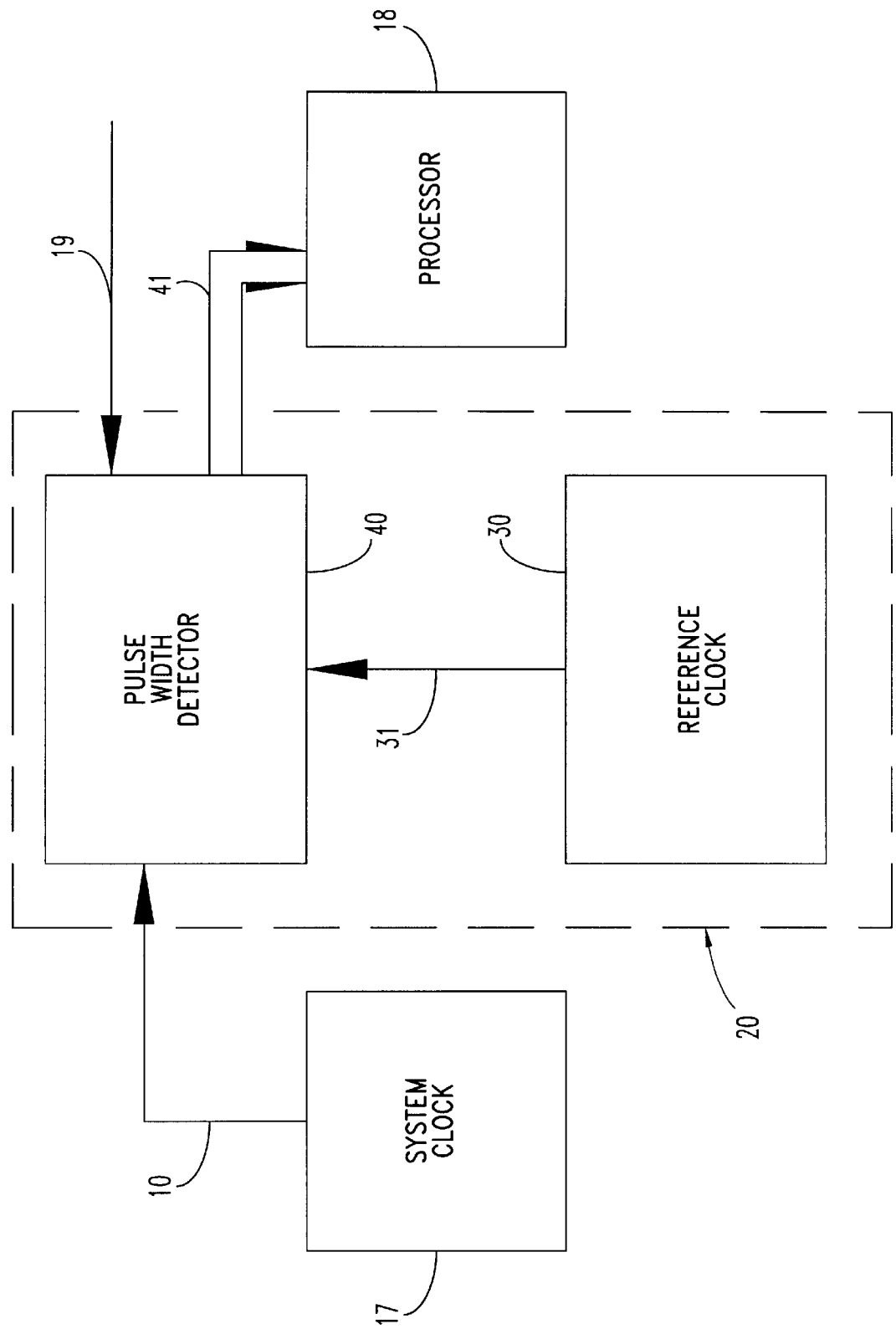
FIG. 3 is a block diagram of a preferred embodiment of a system clock signal monitor of the present invention.

FIG. 3 is a block diagram of a preferred embodiment of a system clock signal monitor 20 in accordance with the present invention. Referring to FIG. 3, system clock signal monitor 20 comprises a reference clock 30, and a pulse width detector 40. Reference clock 30 is configured to generate a reference clock signal having a plurality of reference clock duty cycles 31. Pulse width detector 40 is adapted to be operatively coupled to a system clock 17 to receive each generated system clock duty cycle 10, and is operatively coupled to reference clock 30 to receive reference clock duty cycles 31. Pulse width detector 40 is configured to compare one or more received reference clock duty cycles 31 to each received system clock duty cycle 10 in order to detect each occurrence of a pulse width violation. The present invention contemplates that pulse width detector 40 can detect each type of pulse width violation. However, the present invention also contemplates that pulse width detector 40 can be configured to detect any subset of pulse width violations types, e.g. the first, second, third, and fourth types of pulse width violations.

Pulse width detector 40 may also be further configured to generate one or more signals 41 indicative of each detected occurrence of a pulse width violation. As will be subsequently described herein, the present invention contemplates that signal(s) 41 are representative of either detection signal(s), error signal(s), or reset signal(s). The present invention also contemplates that signal(s) 41 are transmitted to a processor, and/or to a warning device like a light or horn. Consequently, pulse width detector 40 can be adapted to be operatively coupled to a processor 18 to transmit signal(s) 41 to processor 18 as illustrated in FIG. 3, and/or to a warning device. The advantage of transmitting signal(s) 41 to processor 18 is the opportunity to protect any information being processed from data extraction and unpredictable results. As such, the present invention contemplates that signal(s) 41 may be used to warn or reset processor 18 and that pulse width detector 40 may be further adapted to receive a power-on signal 19 from a power-on source (not shown) of a computer. Power-on signal 19 would disable pulse width detector 40 during the running of either protection/reset procedures and would enable pulse width detector 40 upon completion of the procedures. The advantage of transmitting signal(s) 41 to a warning device is the opportunity for a user of a computer to react accordingly in protecting any information being processed from extraction and unpredictable results. It is to be appreciated and understood that when system clock signal monitor 20 is an assembled component of a computer, pulse width detector 40 is operatively coupled to system clock 17, processor 18 and/or a warning device, and the power-on source.

Figure 4:
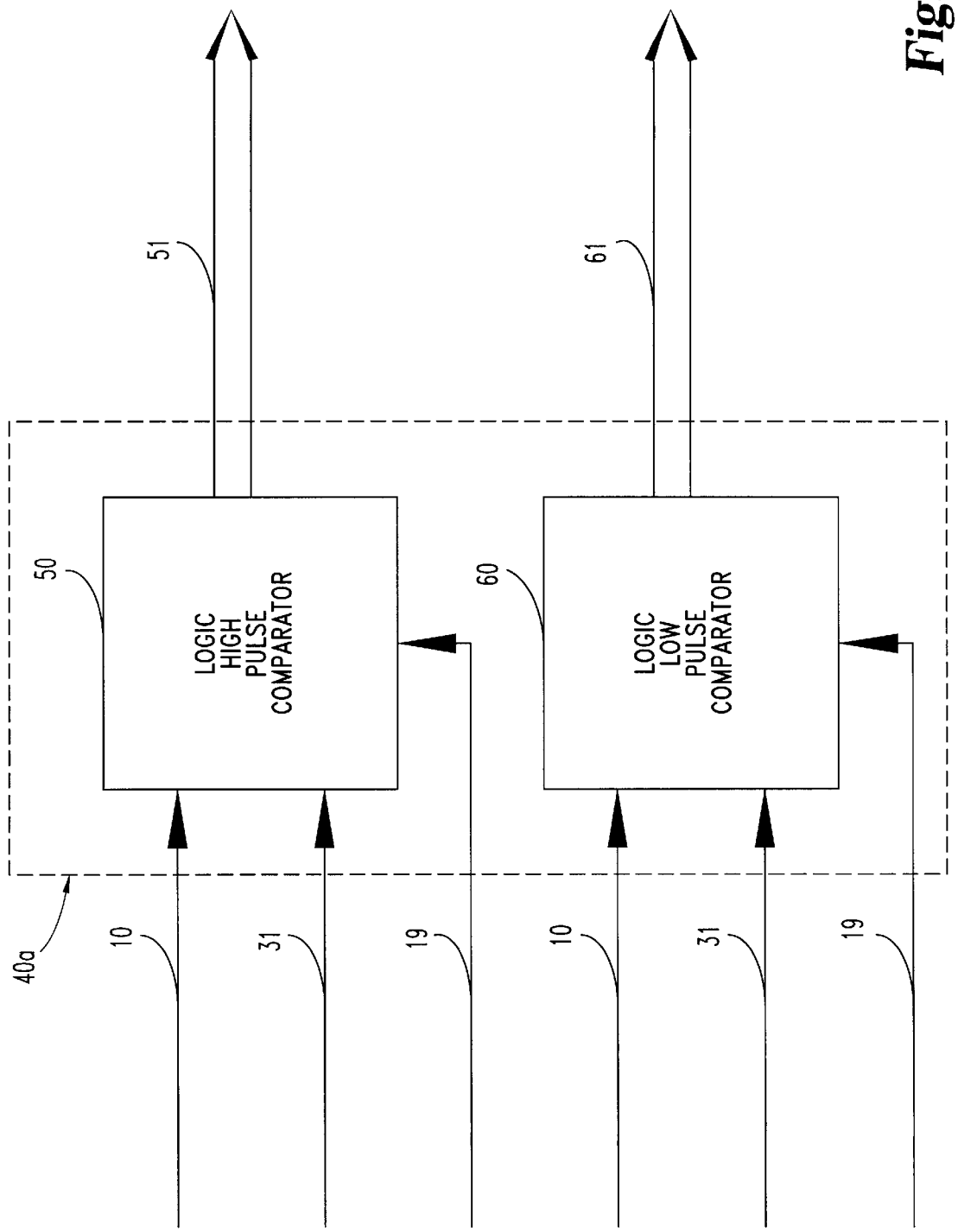
FIG. 4 is a block diagram of a first embodiment of a pulse width detector in accordance with the preferred embodiment of the present invention in FIG. 3.

FIG. 4 is a block diagram of a first embodiment of a pulse width detector 40a. Referring to FIG. 4, pulse width detector 40a includes a logic high pulse comparator 50 and a logic low pulse comparator 60. Logic high pulse comparator 50 and logic low pulse comparator 60 are adapted to receive each system clock duty cycle 10 from system clock 17. In addition, logic high pulse comparator 50 and logic low pulse comparator 60 are operatively coupled to reference clock 30 to receive each generated reference clock duty cycle 31. The present invention contemplates that, for pulse width detector 40a, reference clock duty cycles 31 are generated at a reference frequency that is at least twice as fast as the minimum operating frequency of each system clock duty cycle 10. It is to be appreciated and understood that, due to the reference frequency being at least twice as fast as the minimum operating frequency, at least one reference clock duty cycle 31 is received by pulse width detector 40a during a reception of a logic high pulse 11 by pulse width detector 40a and at least one reference clock duty cycle 31 is received by pulse width detector 40a during a reception of a logic low pulse 12 by pulse width detector 40a. It is to be further appreciated and understood that, when either a received logic high pulse 11 or a received logic low pulse 12 or both equals or exceeds the maximum time interval, it is expected that the minimum number of received reference clock duty cycles 31 during the reception of either logic pulse or both is equal to half the factor of the reference frequency to the minimum operating frequency. Specifically, the expected number of received reference clock duty cycles 31 by pulse width detector 40a during the reception of a logic pulse that equals or exceeds the maximum time interval is one when the reference frequency is twice as fast at the minimum operating frequency, the expected number of received reference clock duty cycles 31 by pulse width detector 40a during the reception of a logic pulse that equals or exceeds the maximum time interval is two when the reference frequency is four times faster than the minimum operating frequency. The expected number of received reference clock duty cycles 31 by pulse width detector 40a during the reception of a logic pulse that equals or exceeds the maximum time interval is three when the reference frequency is six times faster than the minimum operating frequency., and etc.

Still referring to FIG. 4, logic high pulse comparator 50 is configured to compare the received duty cycles 10 and 31 by counting the number of received reference clock duty cycles 31 during the reception of a logic high pulse 11. It is to be appreciated and understood that the when the number of received reference clock duty cycles 31 during the reception of logic high pulse 11 equals or exceeds an expectant count number, a pulse width violation has been detected. Specifically, logic high pulse 11 is either equal to or greater than the maximum time interval. Logic high pulse comparator 50 is further configured to generate one or more detection signals 51 that indicate, individually or collectively, a detected pulse width violation by a received logic high pulse 11. Conversely, logic low pulse comparator 60 is configured to compare the received duty cycles 10 and 31 by counting the number of received reference clock duty cycles 31 during the reception of a logic low pulse 12. It is to be appreciated and understood that when the number of received reference clock duty cycles 31 during the reception of logic low pulse 12 equals or exceeds an expectant count number, a pulse width violation has been detected. Specifically, logic low pulse 12 is either equal to or greater than the maximum time interval. Logic low pulse comparator 60 is further configured to generate one or more signals 61 that indicate, individually or collectively, a detected pulse width violation by a received logic low pulse 12.

Figure 5A:
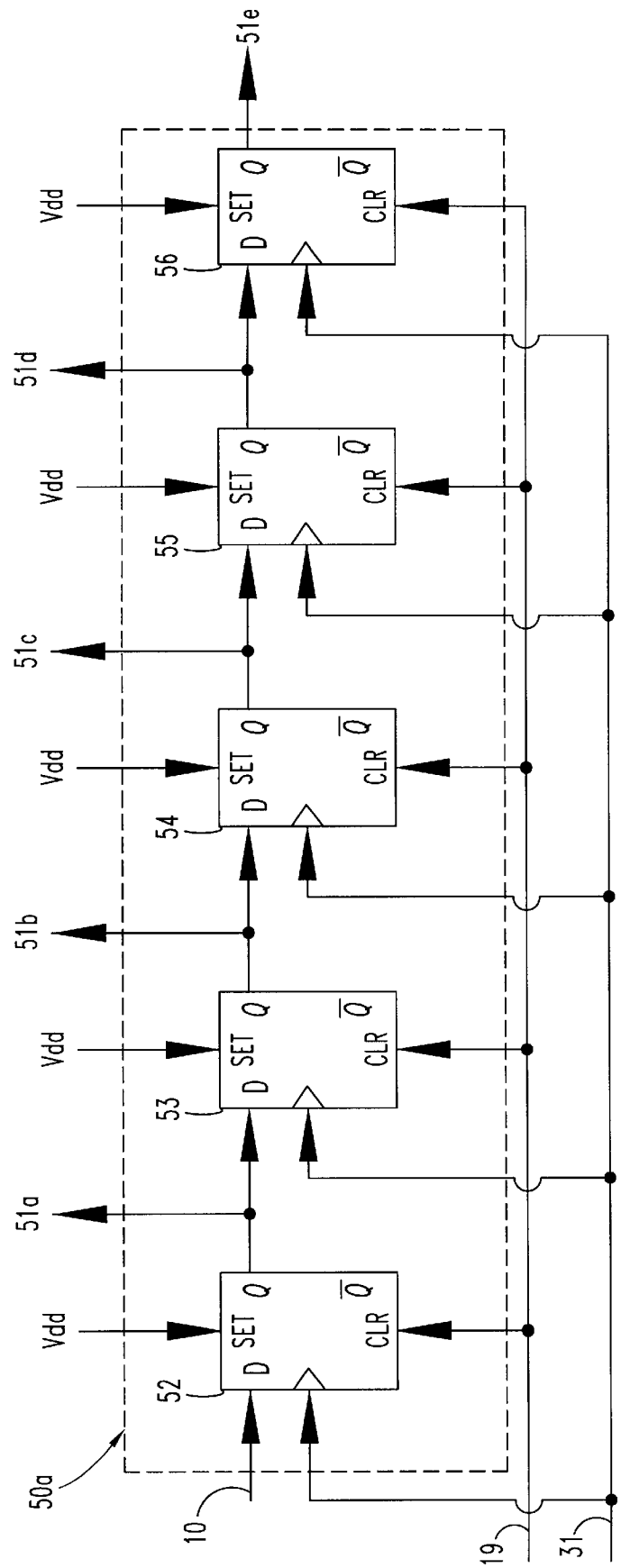
FIG. 5A is a schematic diagram of a preferred embodiment of a logic high pulse comparator in accordance with the first embodiment of the pulse width detector in FIG. 4.
Figure 5B:
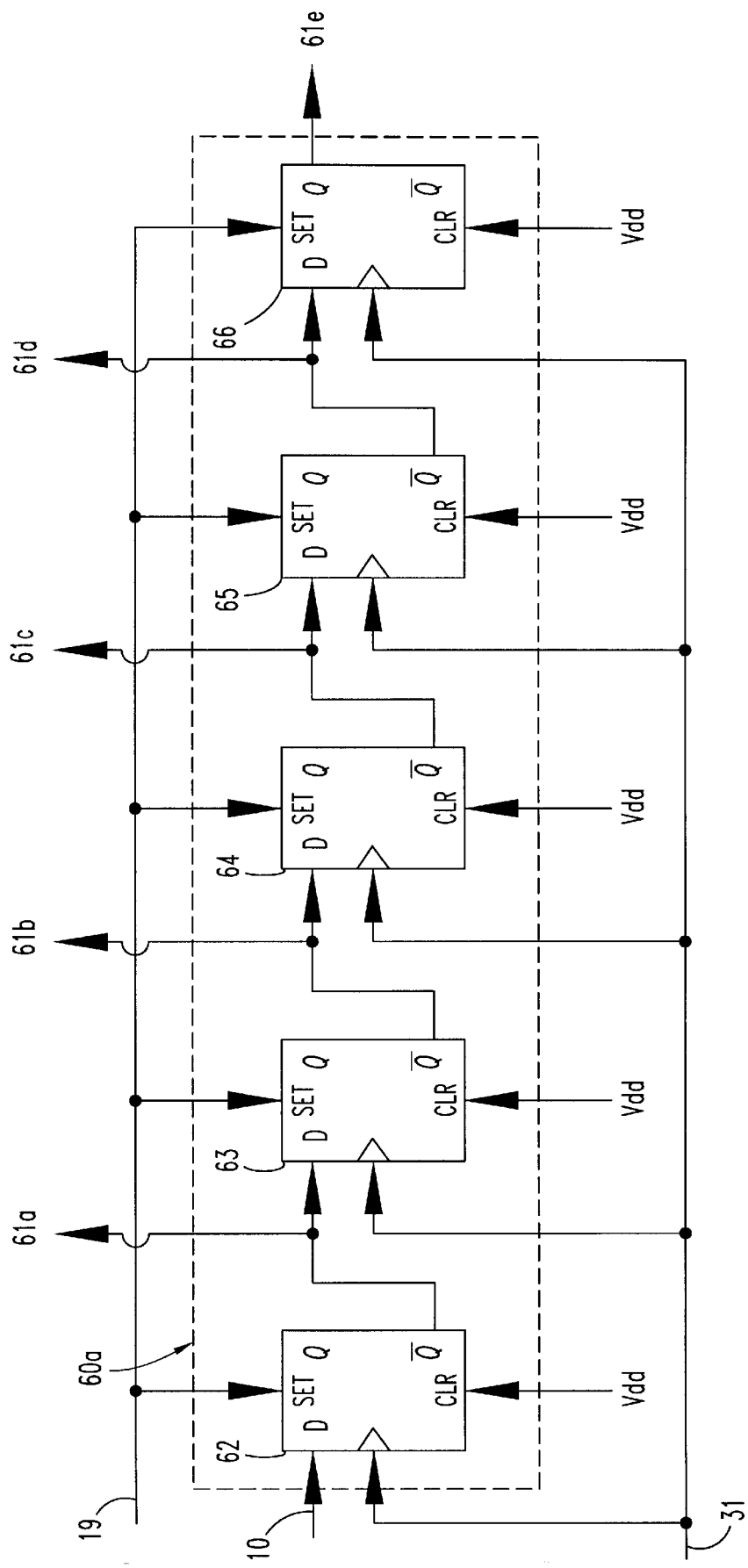
FIG. 5B is a schematic diagram of a preferred embodiment of a logic low pulse comparator in accordance with the first embodiment of the pulse width detector in FIG. 4.

FIGS. 5A and 5B are schematic diagrams of preferred embodiment 50a of logic high pulse comparator 50 and a preferred embodiment 60a of logic low pulse comparator 60, respectively. For purposes of describing FIGS. 5A and 5B, reference clock duty cycles 31 will be described herein as being generated at a reference frequency that is ten times faster than the minimum operating frequency of each system clock duty cycle 10. FIG. 5C is an illustration of a plurality of reference clock duty cycles 31, each reference clock duty cycle 31 having a logic high pulse 32 and a logic low pulse 33. Referring to FIG. 5C, it is to be appreciated and understood that, due to the reference frequency of reference clock duty cycles 31 being ten times faster than the minimum operating frequency of each system clock duty cycle 10, at least five reference clock duty cycles 31 are expected to be received by logic high pulse comparator 50a for each logic high pulse 11 received by logic high pulse comparator 50a that has a pulse width 13 that is equal to or greater than the maximum time interval. Likewise, at least five reference clock duty cycles 31 are expected to be received by logic low pulse comparator 60a for received logic low pulse 12 received by logic low pulse comparator 60a that has a pulse width 14 that is equal to or greater than the maximum time interval.

Referring to FIG. 5A, logic high pulse comparator 50a includes a flip-flop 52, a flip-flop 53, a flip-flop 54, a flip-flop 55 and a flip-flop 56 coupled together as a shift register. It is to be appreciated and understood that the number of flip-flops of logic high pulse comparator 50a correspond to the expectant number of received reference clock duty cycles 31 when a logic high pulse 11 received by logic high pulse comparator 50a has a pulse width 13 that equals or exceeds the maximum time interval. While the present invention contemplates that flip-flops 52, 53, 54, 55 and 56 can be of any type, for purposes of describing logic high pulse comparator 50a, flip-flops 52, 53, 54, 55 and 56 are shown as D-type edge-triggered flip-flops. Flip-flops 52, 53, 54, 55 and 56 each have a clock signal input that is operatively coupled to reference clock 30 to receive reference clock duty cycles 31. Flip-flops 52, 53, 54, 55 and 56 each have a set signal input SET that is operatively coupled to a power source Vdd to continuously receive a logic high signal. Flip-flop 52 further has a signal input D adapted to input each received system clock duty cycle 10 by logic high pulse comparator 50*a* in response to reference clock duty cycles 31, and a signal output Q that transmits each inputted system clock duty cycle 10 in response to reference clock duty cycles 31. Flip-flop 53 further has a signal input D operatively coupled to signal output Q of flip-flop 52 to input each outputted system clock duty cycle 10 from flip-flop 52 in response to reference clock duty cycles 31, and a signal output Q that transmits each inputted system clock duty cycle 10 in response to reference clock duty cycles 31.

Still referring to FIG. 5A, flip-flop 54 further has a signal input D operatively coupled to signal output Q of flip-flop 53 to input each outputted system clock duty cycle 10 from flip-flop 53 in response to reference clock duty cycles 31, and a signal output Q that transmits each inputted system clock duty cycle 10 in response to reference clock duty cycles 31. Flip-flop 55 further has a signal input D operatively coupled to signal output Q of flip-flop 54 to input each outputted system clock duty cycle 10 from flip-flop 54 in response to reference clock duty cycles 31, and a signal output Q that transmits each inputted system clock duty cycle 10 in response to reference clock duty cycles 31. Flip-flop 56 further has a signal input D operatively coupled to signal output Q of flip-flop 55 to input each outputted system clock duty cycle 10 from flip-flop 55 in response to reference clock duty cycles 31, and a signal output Q that transmits each inputted system clock duty cycle 10 in response to reference clock duty cycles 31. Flip-flops 52, 53, 54, 55 and 56 each further has a clear signal input CLR, and the present invention contemplates that power-on signal 19 can be inputted into the clear signal input CLR of flip-flops 52, 53, 54, 55 and 56 as illustrated. Each outputted system clock duty cycle 10 from flip-flops 52, 53, 54, 55 and 56 represent detection signals 51*a*, 51*b*, 51*c*, 51*d* and 51*e*, respectively.

Referring to FIGS. 5A and 5C, it is to be appreciated and understood that when a pulse width 13 of a received logic high pulse 11 is less than the maximum time interval and not within risk range 15, four or less detection signal 51*a*, 51*b*, 51*c*, 51*d* and 51*e* are a logic high at any given time that four or less detection signals 51*a*, 51*b*, 51*c*, 51*d* and 51*e* are a logic high at any given time. Consequently, the pulse width 13 of the received logic high pulse 11 does not constitute a pulse width violation. It is to be further appreciated and understood that when a pulse width 13 of a received logic high pulse 11 is equal to or greater than the maximum time interval, or within risk range 15, all detection signals 51*a*, 51*b*, 51*c*, 51*d* and 51*e* are a logic high during one or more reference clock duty cycles 31. Consequently, pulse width 13 of the received logic high pulse 11 does constitute a pulse width violation.

Referring to FIG. 5B, logic low pulse comparator 60*a* includes a flip-flop 62, a flip-flop 63, a flip-flop 64, a flip-flop 65 and a flip-flop 66 coupled together as a shift register. It is to be appreciated and understood that the number of flip-flops of logic low pulse comparator 60*a* correspond to the expectant number of reference clock duty cycles 31 when a logic low pulse 12 received by logic low pulse comparator 60*a* equals or exceeds the maximum time interval. While the present invention contemplates that flip-flops 62, 63, 64, 65 and 66 can be of any type, for purposes of describing logic low pulse comparator 60*a*, flip-flops 62, 63, 64, 65 and 66 are shown as D-type edge-triggered flip-flops. Flip-flops 62, 63, 64, 65 and 66 each have a clock signal input that is operatively coupled to reference clock 30 to receive reference clock duty cycles 31. Flip-flops 62, 63, 64, 65 and 66 each have a clear signal input CLR that is operatively coupled to a power source Vdd to continuously receive a logic high signal. Flip-flop 62 further has a signal input D adapted to input each received system clock duty cycle 10 by logic low comparator 60*a* in response to reference clock duty cycles 31, and an inverted signal output $\overline{Q}$ that transmits each inputted system clock duty cycle 10 in response to reference clock duty cycles 31. Flip-flop 63 further has a signal input D operatively coupled to inverted signal output $\overline{Q}$ of flip-flop 62 to input each outputted system clock duty cycle 10 from flip-flop 62 in response to reference clock duty cycles 31, and an inverted signal output $\overline{Q}$ that transmits each inputted system clock duty cycle 10 in response to reference clock duty cycles 31.

Still referring to FIG. 5B, flip-flop 64 further has a signal input D operatively coupled to inverted signal output $\overline{Q}$ of flip-flop 63 to input each outputted system clock duty cycle 10 from flip-flop 63 in response to reference clock duty cycles 31, and an inverted signal output $\overline{Q}$ that transmits each inputted system clock duty cycle 10 in response to reference clock duty cycles 31. Flip-flop 65 further has a signal input D operatively coupled to inverted signal output $\overline{Q}$ of flip-flop 64 to input each outputted system clock duty cycle 10 from flip-flop 64 in response to reference clock duty cycles 31, and an inverted signal output $\overline{Q}$ that transmits each inputted system clock duty cycle 10 in response to reference clock duty cycles 31. Flip-flop 66 further has a signal input D operatively coupled to inverted signal output $\overline{Q}$ of flip-flop 65 to input each outputted system clock duty cycle 10 from flip-flop 65 in response to reference clock duty cycles 31, and an inverted signal output $\overline{Q}$ that transmits each inputted system clock duty cycle 10 in response to reference clock duty cycles 31. Flip-flops 62, 63, 64, 65 and 66 each further has a set signal input SET, and the present invention contemplates that power-on signal 19 can be inputted into the set signal input SET of flip-flops 62, 63, 64, 65 and 66 as illustrated. Each outputted system clock duty cycle 10 from flip-flops 62, 63, 64, 65 and 66 represents detection signals 61*a*, 61*b*, 61*c*, 61*d* and 61*e*, respectively.

Referring to FIGS. 5B and 5C, it is to be appreciated and understood that when a pulse width 14 four or less detection signal 61*a*, 61*b*, 61*c*, 61*d* and 61*e* are a logic high at any given time is less than the maximum time interval and not within risk range 16, a received logic low pulse 12. Consequently, pulse width 14 of the received logic low pulse 12 does not constitute a pulse width violation. It is to be further appreciated and understood that when a pulse width 14 of a received logic low pulse 12 is equal to or greater than the maximum time interval, or within risk range 16, all detection signals 61*a*, 61*b*, 61*c*, 61*d* and 61*e* are a logic high during one or more reference clock duty cycles 31. Consequently, pulse width 14 of the received logic low pulse 12 does constitute a pulse width violation.

The advantage of logic high pulse comparator 50*a* and logic low pulse comparator 60*a* is that every type of pulse width violation can be detected. An additional advantage of logic high pulse comparator 50*a* and logic low pulse comparator 60*a* is processor 18 can determine if a received logic high pulse 11 and/or a received logic low pulse is responsible for a detected pulse width violation when detection signals 51*a*–51*e* and/or detection signals 61*a*–61*e*, respectively, are transmitted to processor 18 as signals 41 of FIG. 3. A further advantage of logic high pulse comparator 50*a* and logic low pulse comparator 60*a* is the ability to use detection signals 51*a*–51*e* and detection signals 61*a*–61*e* as reset signals 41 of FIG. 3 in order to initiate protection/reset procedures for processor 18 or to activate a warning device.

Figure 6A:
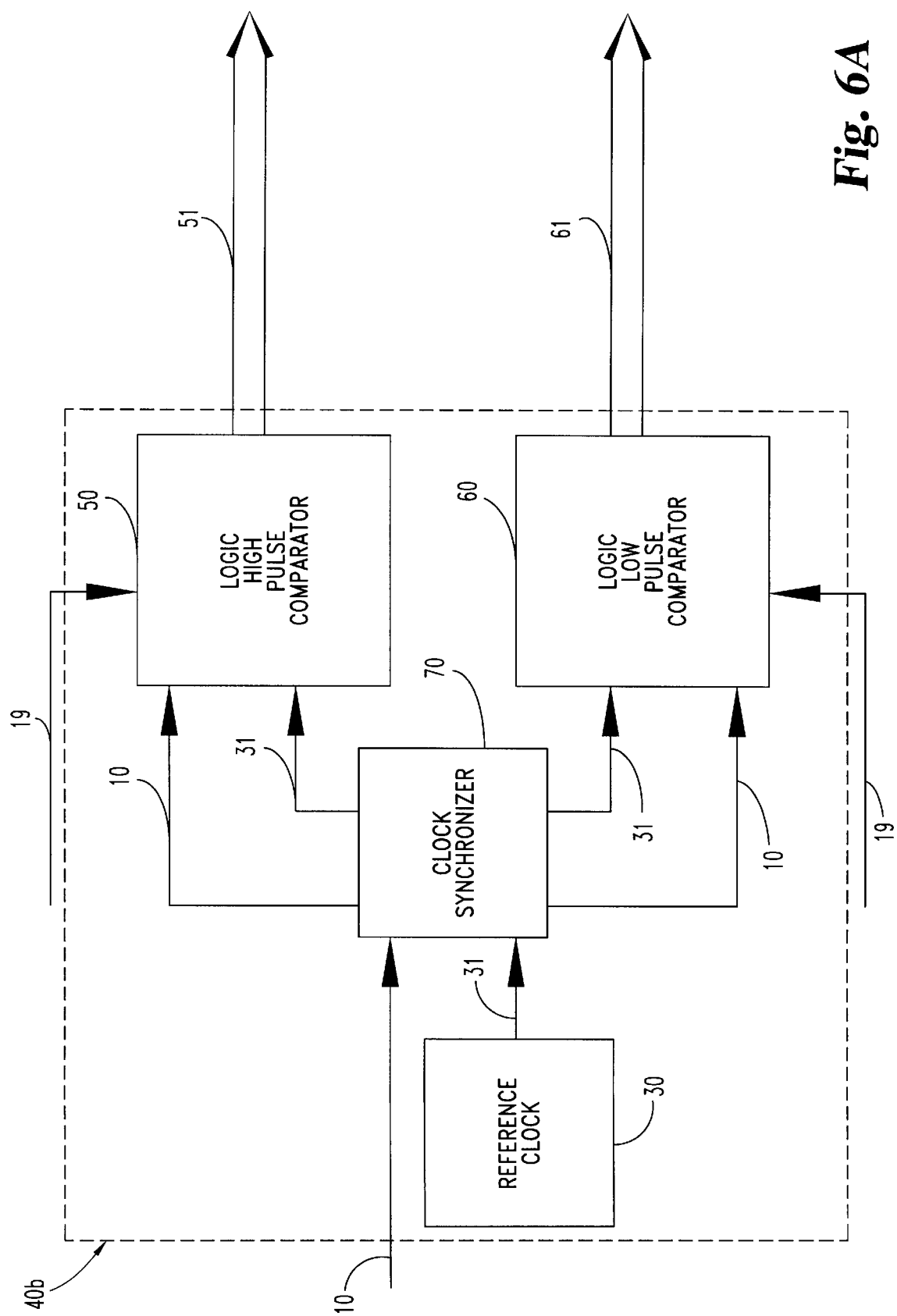
FIG. 6A is a block diagram of a second embodiment of a pulse width detector in accordance with the preferred embodiment of the present invention in FIG. 3.

FIG. 6A is a block diagram of a second embodiment of a pulse width detector 40*b*. Referring to FIG. 6A, pulse width detector 40b includes logic high pulse comparator 50, logic low pulse comparator 60, and a clock synchronizer 70. Clock synchronizer 70 is operatively coupled to reference clock 30 to receive reference clock duty cycles 31, and is adapted to be operatively coupled to system clock 17 to receive each generated system clock duty cycle 10. Clock synchronizer 70 is configured to synchronize each received system clock duty cycle 10 to reference clock duty cycles 31. Logic high pulse comparator 50 and logic low pulse comparator 60 are operatively coupled to clock synchronizer 70 to receive each synchronized system clock duty cycle 10 and reference clock duty cycles 31. The advantage of clock synchronizer 70 is an increased exactness in counting received reference clock duty cycles 31 per received logic high pulse 11 by logic high pulse comparator 50 and in counting received reference clock duty cycles 31 per received logic low pulse 12 by logic low pulse comparator 60.

Figure 6B:
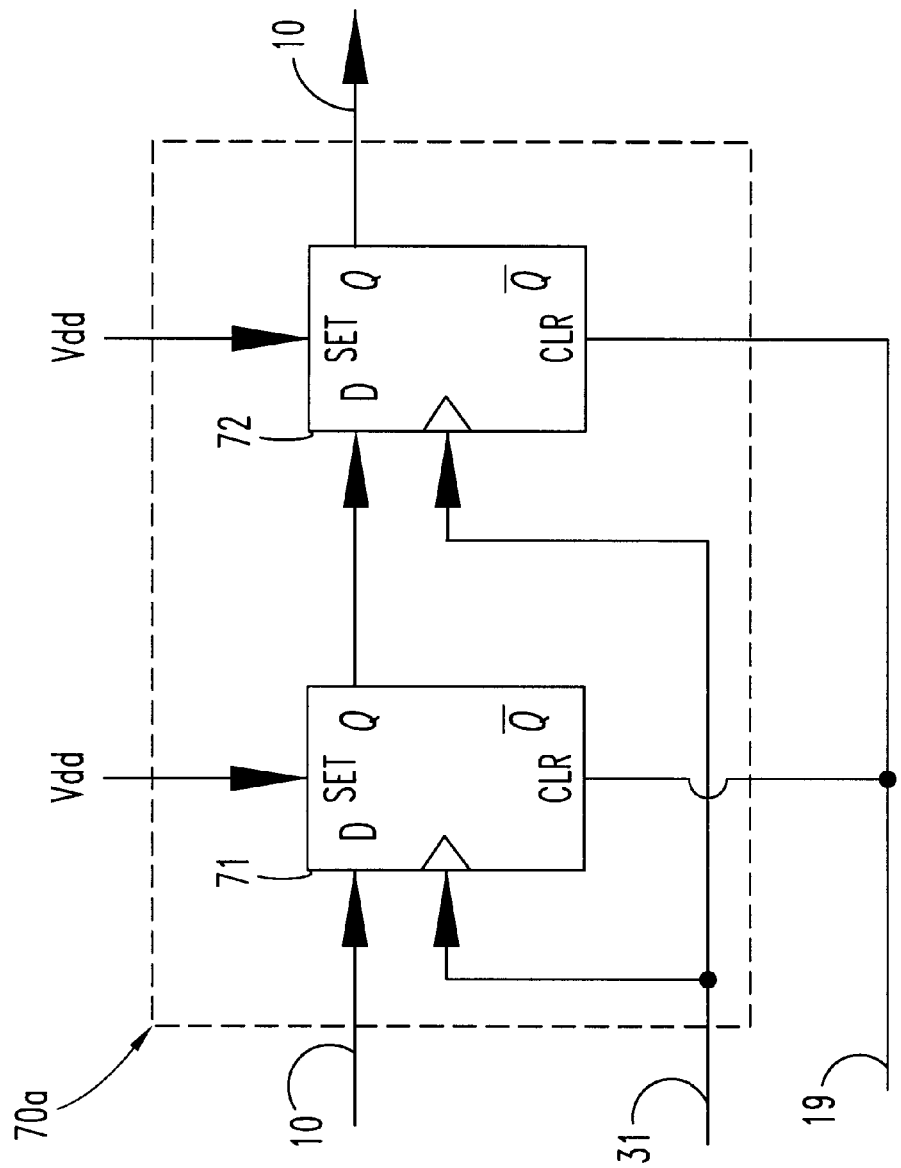
FIG. 6B is a schematic diagram of a preferred embodiment of a clock synchronizer in accordance with the second embodiment of the pulse width detector in FIG. 6A.

FIG. 6B is a schematic diagram of a preferred embodiment 70a of clock synchronizer 70. Referring to FIG. 6B, clock synchronizer 70a includes a flip-flop 71 and a flip-flop 72. While the present invention contemplates that flip-flops 71 and 72 can be of any type, for purposes of describing clock synchronizer 70a, flip-flops 71 and 72 are shown as D-type edge-triggered flip-flops. Flip-flops 71 and 72 both have a clock signal input operatively coupled to reference clock 30 to receive reference clock duty cycles 31. Flip-flops 71 and 72 each have a set signal input SET that is operatively coupled to a power source Vdd to continuously receive a logic high signal. Flip-flop 71 further has a signal input D adapted to be operatively coupled to system clock 17 to input each system clock duty cycle 10 received by pulse width monitor 40b in response to reference clock duty cycles 31, and a signal output Q to output each inputted system clock duty cycle 10 in response to reference clock duty cycles 31. Flip-flop 72 further has a signal input D operatively coupled to signal output Q of flip-flop 71 to input each outputted system clock duty cycle 10 from flip-flop 71 in response to reference clock duty cycles 31, and a signal output Q to output each inputted system clock duty cycle 10 in response to reference clock duty cycles 31. Flip-flops 71 and 72 each further has a clear signal input CLR, and the present invention contemplates that power-on signal 19 can be inputted into the clear signal input CLR of flip-flops 71 and 72 as illustrated. The present invention further contemplates that signal input D of flip-flop 52 of logic high pulse comparator 50a, and that signal input D of flip-flop 62 of logic low pulse comparator 60a can be operatively coupled to signal output Q of flip-flop 72 to receive each synchronized system clock duty cycle 10 of the signal clock signal.

Figure 7A:
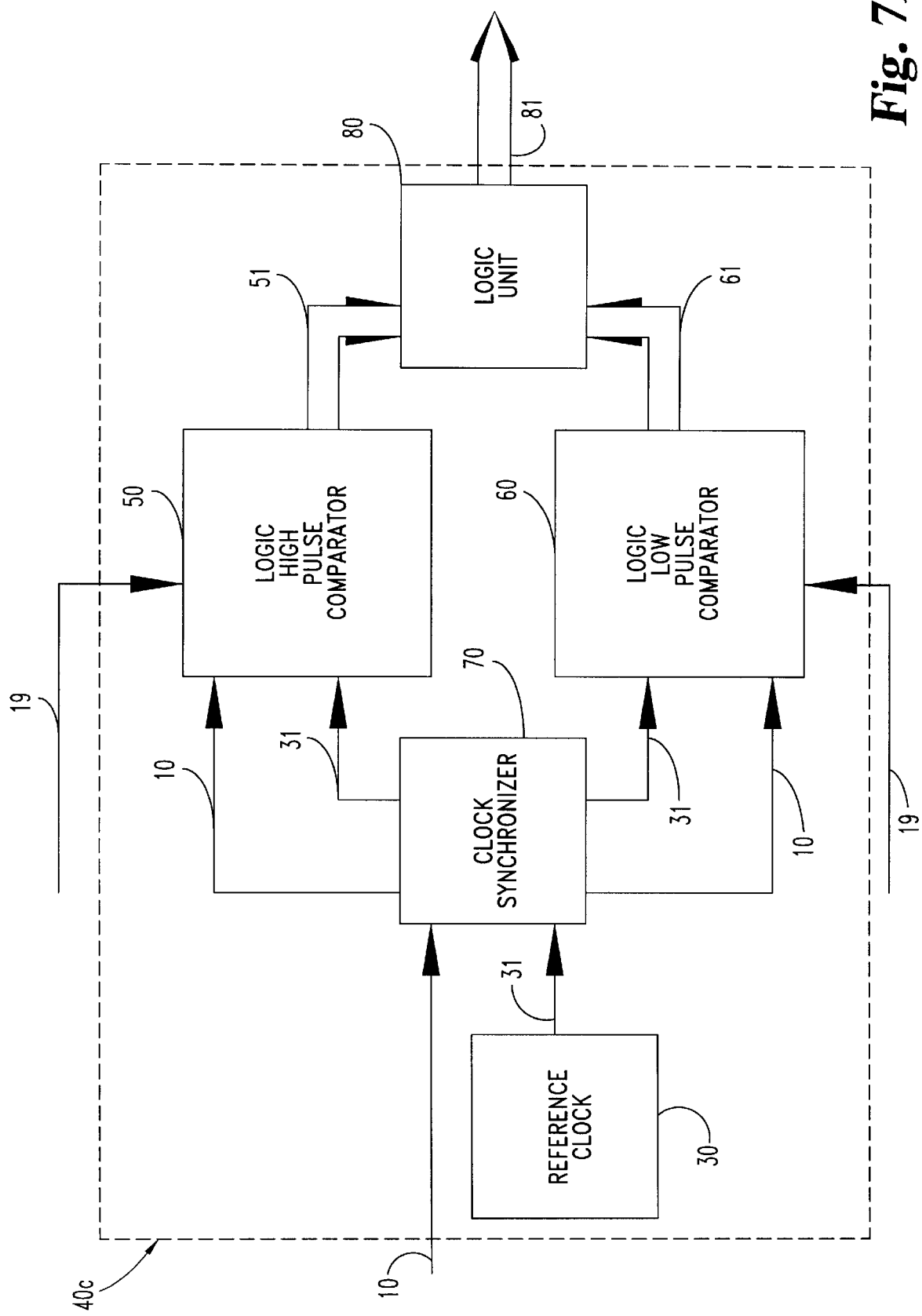
FIG. 7A is a block diagram of a third embodiment of a pulse width detector in accordance with the preferred embodiment of the present invention in FIG. 3.

FIG. 7A is a block diagram of a third embodiment of a pulse width detector 40c. Referring to FIG. 7A, pulse width detector 40c includes logic high pulse comparator 50, logic low pulse comparator 60, clock synchronizer 70, and a logic unit 80. Logic unit 80 is operatively coupled to logic high pulse comparator 50 to receive detection signal(s) 51, and is operatively coupled to logic low pulse comparator 60 to receive detection signal(s) 61. Logic unit 80 is configured to generate one or more error signals 81 for each detected pulse width violation by logic high pulse comparator 50 and by logic low pulse comparator 60. The present invention contemplates that logic unit 80 may be adapted to be operatively coupled to processor 18, and/or a warning device to transmit one or more error signals 81 as signals 41 to processor 18 and/or to the warning device.

Figure 7B:
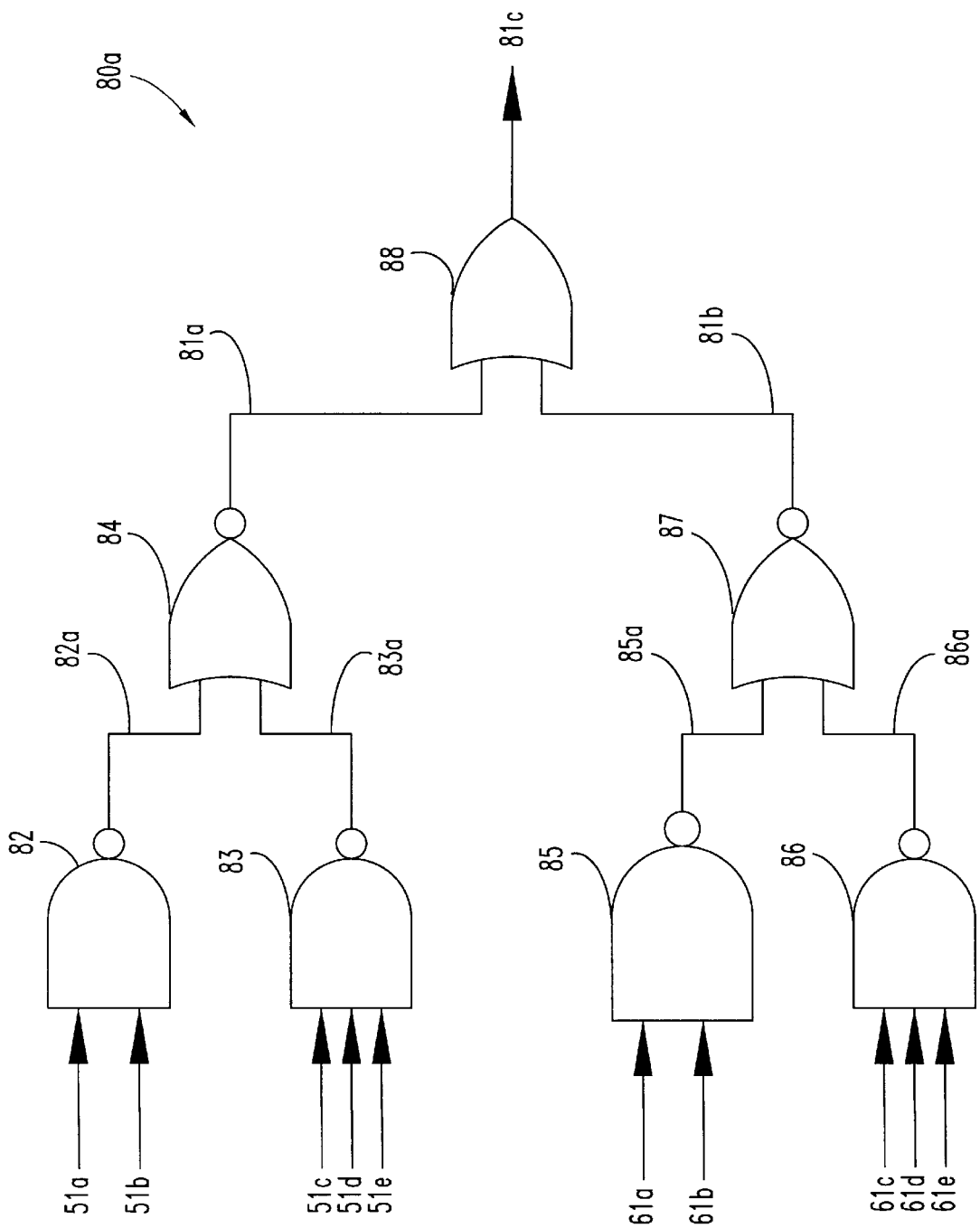
FIG. 7B is a schematic diagram of a preferred embodiment of a logic unit in accordance with the third embodiment of the pulse width detector in FIG. 7A.

FIG. 7B is a schematic diagram of a preferred embodiment 80a of a logic unit 80. Referring to FIG. 7D, logic unit 80a includes a NAND gate 82, a NAND gate 83, a NOR gate 84, a NAND gate 85, a NAND gate 86, a NOR gate 87 and an OR gate 88. The present invention contemplates that NAND gate 81 is operatively coupled to flip-flop 52 to receive detection signal 51a and is operatively coupled to flip-flop 53 to receive detection signal 51b. It is to be appreciated and understood that NAND gate 82 outputs a signal 82a as a logic low whenever detection signals 51a and 51b are a logic high, and outputs signal 82a as a logic high whenever detection signal 51a is a logic low, or detection signal 51b is a logic low or both. The present invention contemplates that NAND gate 83 is operatively coupled to flip-flop 54 to receive detection signal 51c, is operatively coupled to flip-flop 55 to receive detection signal 51d and is operatively coupled to flip-flop 56 to receive detection signal 51e. It is to be appreciated and understood that NAND gate 83 outputs a signal 83a as a logic low whenever detection signals 51c, 51d and 51e are a logic high, and outputs signal 83a as a logic high whenever detection signal 51c is a logic low, or detection signal 51d is a logic low, or detection signal 51e is a logic low, or any combination of detection signals 51c, 51d and 51e are a logic low. NOR gate 84 is operatively coupled to NAND gate 82 to receive signal 82a, and is operatively coupled to NAND gate 83 to receive signal 83a. It is to be appreciated and understood that NOR gate 84 outputs an error signal 81a as a logic high whenever both signals 82a and 83a are a logic low, and outputs error signal 81a as a logic low whenever signal 82a is a logic high, or signal 83a is a logic high, or both. It is to be appreciated and understood that error signal 81a can be transmitted from logic unit 80. Thus, the present invention contemplates that NOR gate 84 can be adapted to be operatively coupled to processor 18 to transmit error signal 81a as an error signal 41 in FIG. 3 to processor 18 in order to initiate protection/reset procedures upon a detection of a pulse width violation by a logic high pulse 11 received by pulse width monitor 40c, and/or adapted to be operatively coupled to a warning device to transmit signal 81 a to the warning device in order to activate the warning device upon a detection of a pulse width violation by a logic high pulse 11 received by pulse width monitor 40c.

Still referring to FIG. 7B, the present invention contemplates that NAND gate 85 is operatively coupled to flip-flop 62 to receive detection signal 61a and is operatively coupled to flip-flop 63 to receive detection signal 61b. It is to be appreciated and understood that NAND gate 85 outputs a signal 85a as a logic low whenever detection signals 61a and 61b are a logic high, and outputs signal 85a as a logic high whenever detection signal 61a is a logic low, or detection signal 61b is a logic low or both. The present invention contemplates that NAND gate 86 is operatively coupled to flip-flop 64 to receive detection signal 61c, is operatively coupled to flip-flop 65 to receive detection signal 61d and is operatively coupled to flip-flop 66 to receive detection signal 61e. It is to be appreciated and understood that NAND gate 86 outputs a signal 86a as a logic low whenever detection signals 61c, 61d and 61e are a logic high, and outputs signal 86a as a logic high whenever detection signal 61c is a logic low, or detection signal 61d is a logic low, or detection signal 61e is a logic low, or any combination of detection signals 61c, 61d and 61e are a logic low. NOR gate 87 is operatively coupled to NAND gate 85 to receive signal 85a, and is operatively coupled to NAND gate 86 to receive signal 86a. It is to be appreciated and understood that NOR gate 87 outputs an error signal 81b as a logic high whenever signals 85a and 86a are a logic low, and outputs error signal 81b as a logic low whenever signal 85a is a logic high, or signal 86a is a logic high, or both. It is to be appreciated and understood that signal 81b can be transmitted from logic unit 80. Thus, the present invention contemplates that NOR gate 87 can be adapted to be operatively coupled to processor 18 to transmit error signal 81b as an error signal 41 in FIG. 3 to processor 18 in order to initiate protection/reset procedures upon a detection of a pulse width violation by a logic low pulse 12 received by pulse width monitor 40c, and/or adapted to be operatively coupled to a warning device to transmit error signal 81b to the warning device in order to activate the warning device upon a detection of a pulse width violation by a logic low pulse 12 received by pulse width monitor 40c.

Still referring to FIG. 7B, OR gate 88 is operatively coupled to NOR gate 84 to receive error signal 81a and is operatively coupled to NOR gate 87 to receive error signal 81b. It is to be appreciated and understood that OR gate 88 outputs an error signal 81c as a logic high whenever error signal 81a is a logic high, or error signal 81b is a logic high, or both, and outputs error signal 81c as a logic low whenever error signals 81a and 81b are both a logic low. It is to be further appreciated and understood that error signal 81c can be transmitted from logic unit 80. Thus, the present invention contemplates that OR gate 88 can be adapted to be operatively coupled to processor 18 to transmit error signal 81c as an error signal 41 in FIG. 3 to processor 18 in order to initiate protection/reset procedures upon a detection of a pulse width violation by a logic high pulse 11 and/or a logic low pulse 12 received by pulse width monitor 40c. The present invention further contemplates that OR gate 88 can be adapted to be operatively coupled to a warning device to transmit error signal 81c to the warning device in order to activate the warning device upon a detection of a pulse width violation by a logic high pulse 11 and/or a logic low pulse 12 received by pulse width monitor 40c.

Figure 8A:
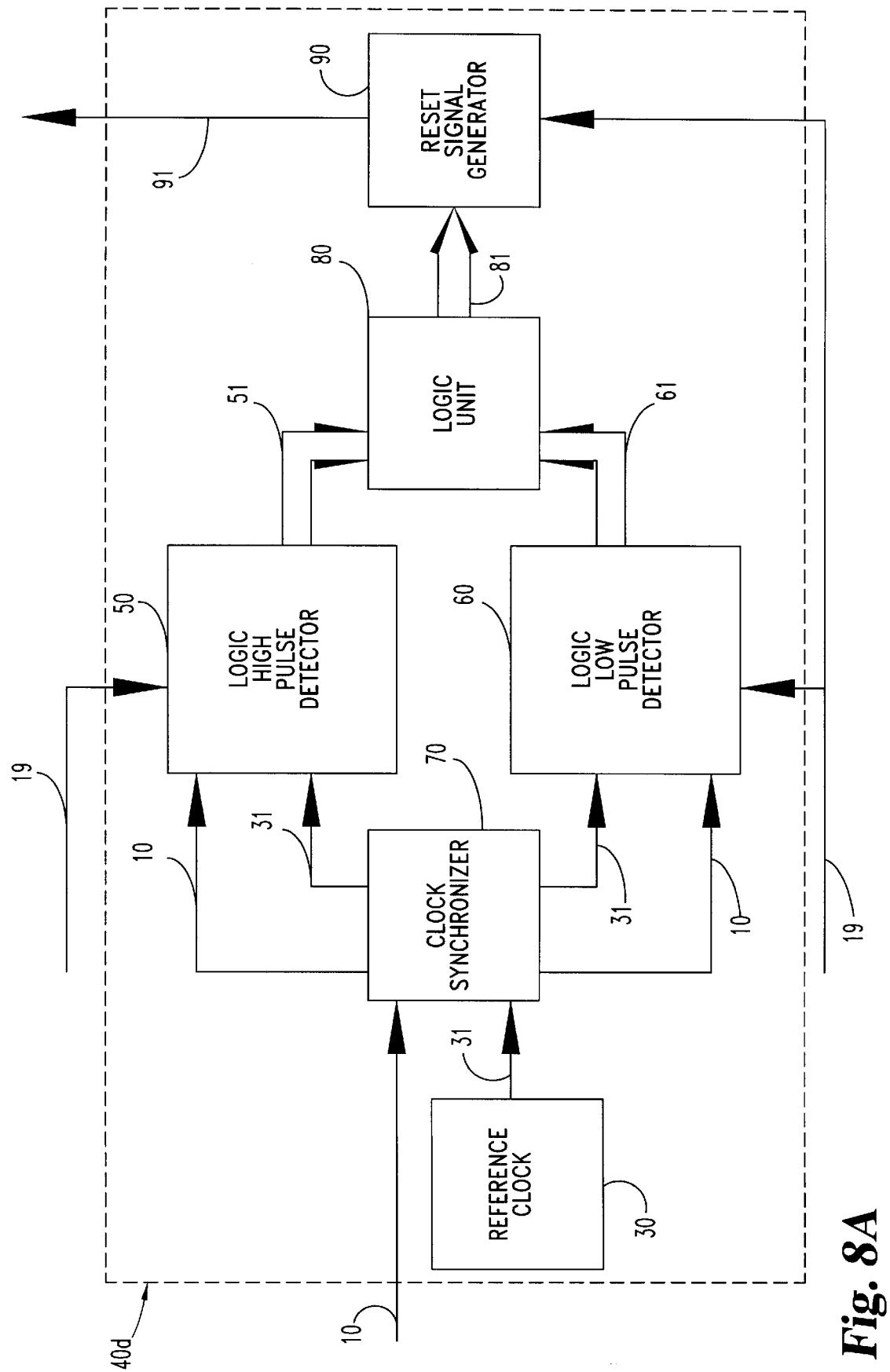
FIG. 8A is a block diagram of a fourth embodiment of a pulse width detector in accordance with the preferred embodiment of the present invention in FIG. 3.

FIG. 8A is a block diagram of a fourth embodiment of a pulse width detector 40d. Referring to FIG. 8A, pulse width detector 40d includes logic high pulse comparator 50, logic low pulse comparator 60, clock synchronizer 70, logic unit 80 and a reset signal generator 90. Reset signal generator 90 is operatively coupled to logic unit 80 to receive one or more error signals 81. Reset signal generator 90 is configured to stabilize one or more error signals 81. The present invention contemplates that reset signal generator 90 may be adapted to be operatively coupled to processor 18, and/or a warning device to transmit one or more reset signals 91 to processor 18 and/or the warning device. The advantage of reset signal generator 90 is the stabilization of error signal(s) 81 in order to use error signal(s) 81 as a reset signal 91 by processor 18, or a power signal by a warning device.

Figure 8B:
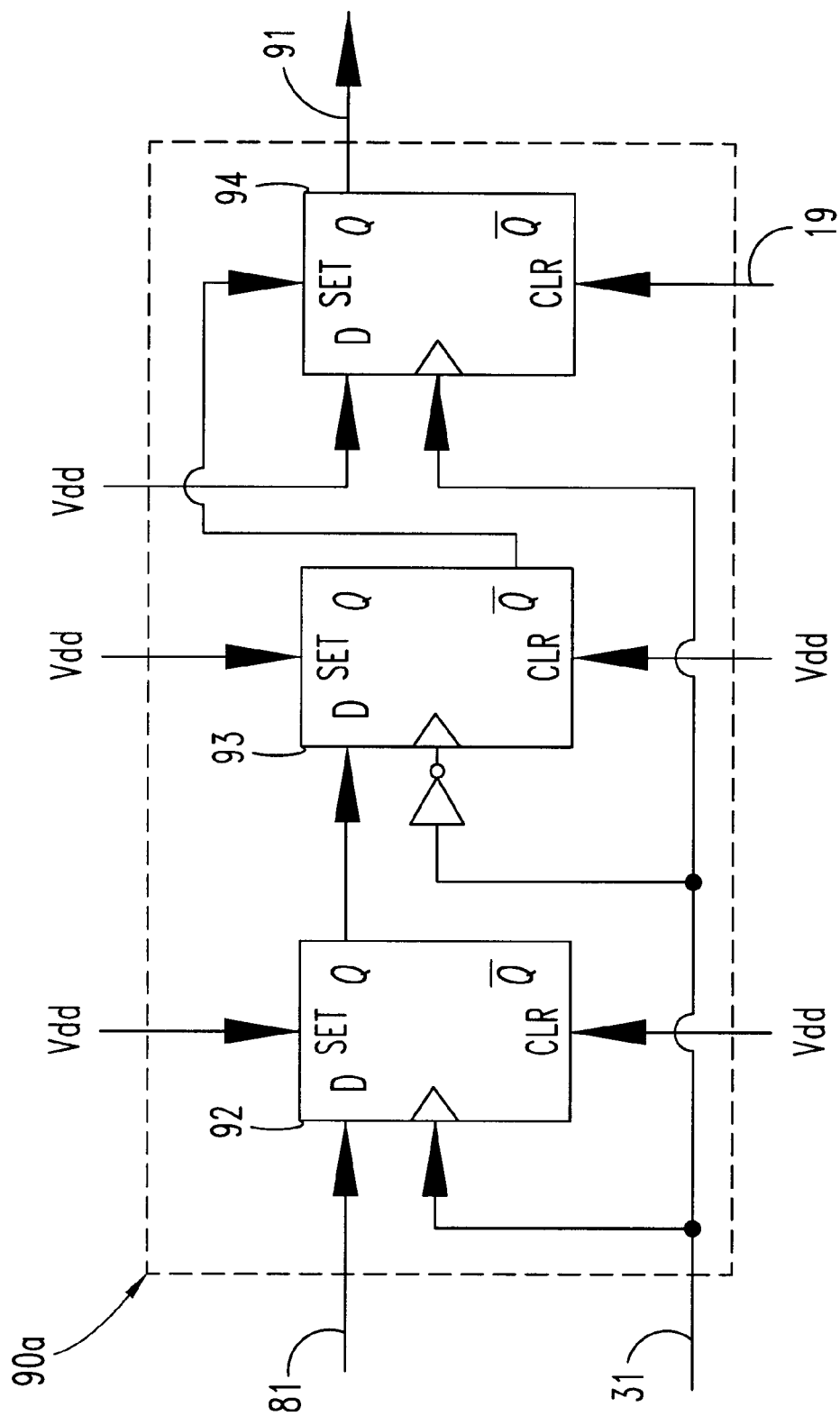
FIG. 8B is a schematic diagram of a first embodiment of a reset signal generator in accordance with the fourth embodiment of the pulse width detector in FIG. 8A.

FIG. 8B is a schematic diagram of a first embodiment 90a of a reset signal generator 90. Referring to FIG. 8B, reset signal generator 90a includes a flip-flop 92, a flip-flop 93 and a flip-flop 94. While the present invention contemplates that flip-flops 92, 93 and 94 can be of any type, for purposes of describing reset signal generator 90a, flip-flops 92, 93 and 94 are shown as D-type edge-triggered flip-flops. Flip-flops 92, 93 and 94 each have a clock signal input operatively coupled to reference clock 30 to receive reference clock duty cycles 31 with the clock signal input of flip-flop 92 being configured to invert reference clock duty cycles 31. Flip-flops 92 and 93 each have a set signal input SET and a clear input signal CLR that are operatively coupled to a power source Vdd to continuously receive a logic high signal. The present invention contemplates that flip-flop 92 further has a signal input D operatively coupled to either NOR gate 84, NOR gate 87 or OR gate 88 to input one of error signals 81a, 81b, and 81c, respectively, in response to reference clock duty cycles 31, and a signal output Q to output each inputted error signal 81 in response to reference clock duty cycles 31. Flip-flop 93 further has a signal input D operatively coupled to signal output Q of flip-flop 92 to input each outputted error signal 81 from flip-flop 92 in response to inverted reference clock duty cycles 31, and an inverted signal output Q̄ to output each inputted error signal 81 as an inverted signal in response to inverted reference clock duty cycles 31. Flip-flop 94 further has a signal input D operatively coupled to a power source Vdd to continuously receive a logic high signal, a set signal SET operatively coupled to inverted signal output Q̄ of flip-flop 93 to input each outputted inverted error signal 81 from flip-flop 93 in response to reference clock duty cycles 31, and a signal output Q to output a reset signal 91 in response to reference clock duty cycles 31. Flip-flops 94 also has a clear signal input CLR, and the present invention contemplates that power-on signal 19 can be inputted into the clear signal input CLR of flip-flop 94 as illustrated. The advantage of reset signal generator 90a is reset signal 91 will be held a logic high until flip-flop 94 is cleared by power-on signal 19. This enables processor 18 to fully implement protection/reset procedures necessary to protect information and to properly reinitialize. This further enables a warning device to continuously warn a user of the system until the successful completion of protection/reset procedures.

Figure 8C:
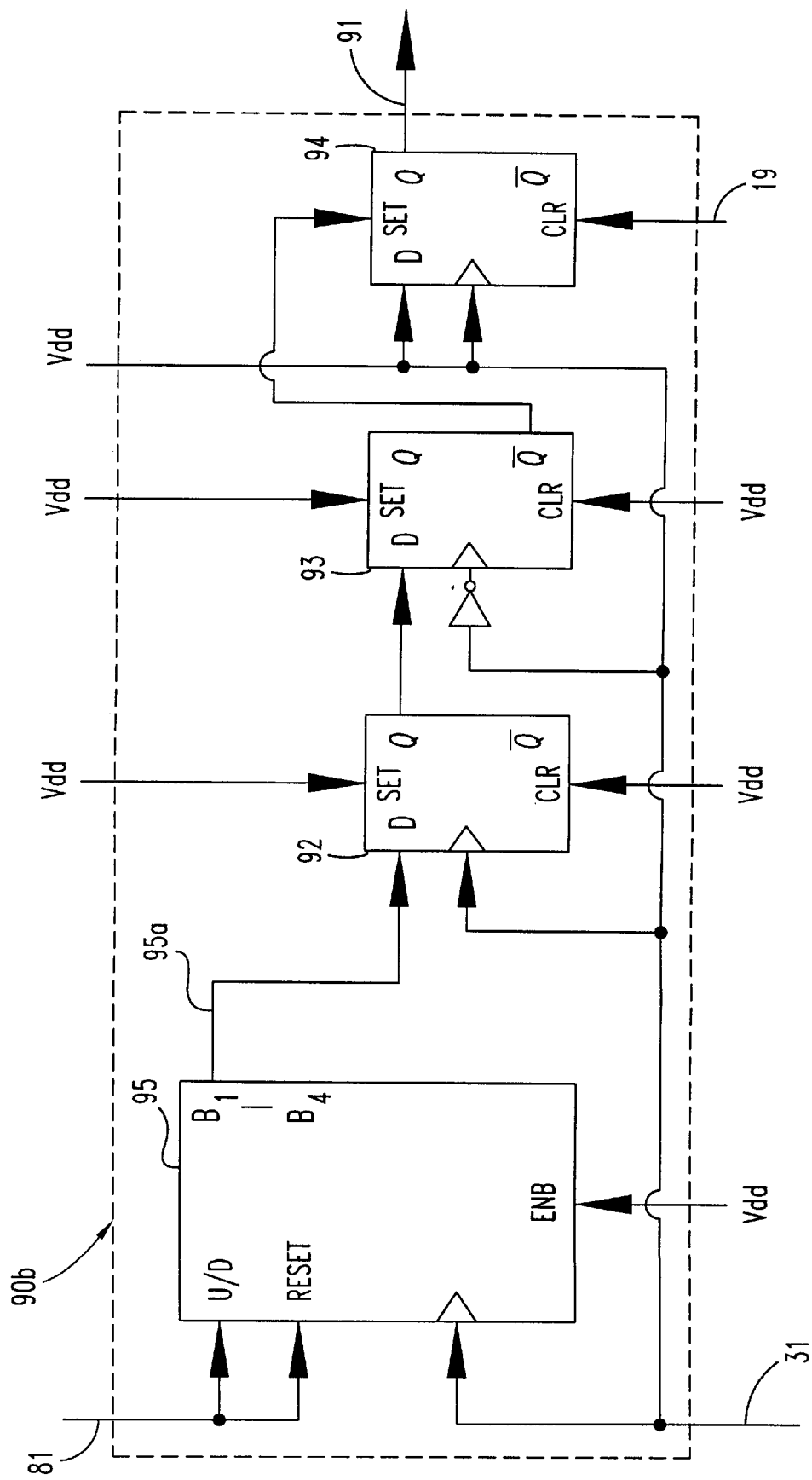
FIG. 8C is a schematic diagram of a second embodiment of a reset signal generator in accordance with the fourth embodiment of the pulse width detector in FIG. 8A.

FIG. 8C is a block diagram of a second embodiment 90b of a reset signal generator 90. Referring to FIG. 8C, reset signal generator 90b includes flip-flop 92, flip-flop-93, flip-flop 94 and a counter 95. For purposes of describing reset signal generator 90b, counter 95 is shown as a 4 bit synchronous counter. However, the present invention contemplates that counter 95 can be any type of counter. Counter 95 has a clock signal input operatively coupled to reference clock 30 to receive reference clock duty cycles 31, and an enable signal input ENB operatively coupled to a power source Vdd to continuously receive a logic high signal. The present invention contemplates that counter 95 further has a reset signal input RESET and a up/down signal input U/D operatively coupled to either NOR gate 84, NOR gate 87 or OR gate 88 to receive either error signals 81a, 81b, or 81c, respectively, and further has one of four output signals B1, B2, B3, or B4 operatively coupled to signal input D of flip-flop 92 to transmit a count signal 95a to flip-flop 92. It is to be appreciated and understood that counter 95 counts each sequential detected pulse width violation as indicated by error signal 81. It is to be further appreciated and understood that count signal 95a is a logic high when counter 95 reaches a predetermined number of sequential detected pulse width violations. Otherwise, the count signal is always a logic low due to the fact that error signal 81 will reset counter 95 prior to reaching the predetermined number of sequential detected pulse width violations if the number of sequentially detected pulse width violations is less than the predetermined number of sequential pulse width violations. The advantage of reset signal generator 90b is that reset signal 91 will not be generated due to sporadic pulse width violations and an insignificant number of sequential pulse width violations. This is beneficial to the overall performance of processor 18 because such pulse width violations are either representative of quirks in system clock 17 or an unsuccessful attempt at manipulating system clock 17.

While the present invention has been illustrated and described in detail in the drawings and foregoing description, the same is to be considered as illustrative and not restrictive in character, it being understood that the preferred embodiments have been shown and described and that all changes and modifications that come within the spirit of the invention are desired to be protected.

What is claimed is:

1. A device for monitoring an operating frequency of a system clock duty cycle, the system clock duty cycle including a logic high pulse having a first time interval and a logic low pulse having a second time interval, said device comprising:

a reference clock to generate a plurality of reference clock duty cycles and a pulse width detector operatively coupled to said reference clock to receive said plurality of reference clock duty cycles and adapted to receive the system clock duty cycle, wherein, upon receipt of said plurality of reference clock duty cycles and the logic high pulse of the system clock duty cycle, said pulse width detector is operable to generate at least a first detection signal in response to an occurrence of a first pulse width violation during the first time interval of the logic high pulse of the system clock duty cycle, and wherein, upon receipt of said plurality of reference clock duty cycles and the logic low pulse of the system clock duty cycle, said pulse width detector is further operable to generate said at least a second detection signal in response to an occurrence of a second pulse width violation during the second time interval of the logic low pulse of the system clock duty cycle.

2. The device of claim 1 wherein said pulse width detector includes:

a first comparator to generate said at least a first detection signal based on a comparison of at least a first reference clock duty cycle of said plurality of reference clock duty cycles to the logic high pulse of the system clock duty cycle; and a second comparator to generate said at least a second detection signal based on a comparison of at least a second reference clock duty cycle of said plurality of reference clock duty cycles to the logic low pulse of the system clock duty cycle.

3. The device of claim 2 wherein said first comparator includes a first shift register operatively coupled to said reference clock to receive said plurality of reference clock duty cycles and adapted to receive the system clock duty cycle, said first shift register to generate said at least a first detection signal during a reception of the logic high pulse of the system clock duty cycle by the first shift register; and wherein said second comparator includes a second shift register operatively coupled to said reference clock to receive said plurality of reference clock duty cycles and adapted to receive the system clock duty cycle, said second shift register to generate said at least a second detection signal during a reception of the logic high pulse of the system clock duty cycle by the second shift register.

4. The device of claim 1 wherein said pulse width detector includes:

a clock synchronizer to synchronize said plurality of reference clock duty cycles and the system clock duty cycle;

a first comparator operatively coupled to said clock synchronizer to receive said plurality of synchronized reference clock duty cycles and the synchronized system clock duty cycle, said first comparator to generate said at least a first reference clock duty cycle of said plurality of synchronized reference clock duty cycles to the logic high pulse of the synchronized system clock duty cycle; and a second comparator operatively coupled to said clock synchronizer to receive said plurality of synchronized reference clock duty cycles and the synchronized system clock duty cycle, said second comparator to generate said at least a second reference clock duty cycle of said plurality of synchronized reference clock duty cycles to the logic low pulse of the synchronized system clock duty cycle.

5. The device of claim 4 wherein said clock synchronizer includes means for synchronously transmitting the logic high pulse of the synchronized system clock duty cycle and said at least a first reference clock duty cycle, and synchronously transmitting the logic low pulse of the synchronized system clock duty cycle and said at least a second reference clock duty cycle.

6. The device of claim 4 wherein said first comparator includes a first shift register operatively coupled to said clock synchronizer to receive said plurality of synchronized reference clock duty cycles and to receive the synchronized system clock duty cycle, said first shift register to generate said at least a first detection signal during a reception of the logic high pulse of the synchronized system clock duty cycle by said first shift register, and wherein said second comparator includes a second shift register operatively coupled to said clock synchronizer to receive said plurality of synchronized reference clock duty cycles and to receive the synchronized system clock duty cycle, said second shift register to generate said at least a second detection signal during a reception of the logic low pulse of the synchronized system clock duty cycle by said second shift register.

7. The device of claim 2 or claim 4 wherein said pulse width detector further includes a logic unit operatively coupled to said first comparator to receive said at least a first detection signal, said logic unit to generate an error signal in response to said at least a first detection signal.

8. The device of claim 7 wherein said pulse width detector further includes a reset signal generator operatively coupled to said logic unit to receive said error signal, said reset signal generator to generate a reset signal in response to said error signal.

9. The device of claim 2 or claim 4 wherein said pulse width detector further includes a logic unit operatively coupled to said second comparator to receive said at least a second detection signal, said logic unit to generate an error signal in response to said at least a second detection signal.

10. The device of claim 9 wherein said pulse width detector further includes a reset signal generator operatively coupled to said logic unit to receive said error signal, said reset signal generator to generate a reset signal in response to said error signal.

11. The device of claim 2 or 4 wherein said pulse width detector further includes a logic unit operatively coupled to said first comparator to receive said at least a first detection signal and operatively coupled to said second comparator to receive said at least a second detection signal, said logic unit to generate an error signal in response to said at least a first detection signal or in response to said at least a second detection signal.

12. The device of claim 9 wherein said pulse width detector further includes a reset signal generator operatively coupled to said logic unit to said error signal, said reset signal generator to generate a reset signal in response to said error signal.

13. A system comprising:
a system clock generating a system clock duty cycle, said system clock duty cycle including a logic high pulse having a first time interval and a logic low pulse having a second time interval;
a reference clock generating a plurality of reference clock duty cycles; and
a pulse width detector operatively coupled to said reference clock to receive said plurality of reference clock duty cycles and operatively coupled to said system clock to receive said system clock duty cycle,
wherein, upon receipt of said plurality of reference clock duty cycles and said logic high pulse of said system clock duty cycle, said pulse width detector generates at least a first detection signal in response to an occurrence of first pulse width violation during said first time interval of said logic high pulse of said system clock duty cycle, and
wherein, upon receipt of said plurality of reference clock duty cycles and said logic low pulse of said system clock duty cycle, said pulse width detector generates at least a second detection signal in response to an occurrence of second pulse width violation during said second time interval of said logic low pulse of said system clock duty cycle.

14. The system of claim 13 wherein said pulse width detector includes:
a first comparator to generate said at least a first detection signal based on a comparison of at least a first reference clock duty cycle of said plurality of reference clock duty cycles to said logic high pulse of said system clock duty cycle; and
a second comparator to generate said at least a second detection signal based on a comparison of at least a second reference clock duty cycle of said plurality of reference clock duty cycles to said logic low pulse of said system clock duty cycle.

15. The system of claim 14 further comprising a processor operatively coupled to said first comparator to receive said at least a first detection signal and operatively coupled to said second comparator to receive said at least a second detection signal.

16. The system of claim 14
wherein said first comparator includes a first shift register operatively coupled to said reference clock to receive said plurality of reference clock duty cycles and operatively coupled to said system clock to receive said system clock duty cycle, said first shift register to generate said at least a first detection signal during a reception of said logic high pulse of said system clock duty cycle by said first shift register, and
wherein said second comparator includes a second shift register operatively coupled to said reference clock to receive said plurality of reference clock duty cycles and operatively coupled to said system clock to receive said system clock duty cycle, said first shift register to generate said at least a second detection signal during a reception of said logic low pulse of said system clock duty cycle by said second shift register.

17. The system of claim 13 wherein said pulse width detector includes:
a clock synchronizer to synchronize said plurality of reference clock duty cycles and said plurality of system clock duty cycles;
a first comparator operatively coupled to said clock synchronizer to receive said plurality of synchronized reference clock duty cycles and said synchronized system clock duty cycle, said first comparator to generate said at least a first detection signal based on a comparison of at least a first reference clock duty cycle of said plurality of synchronized reference clock duty cycles to said logic high pulse of said synchronized system clock duty cycle; and
a second comparator operatively coupled to said clock synchronizer to receive said plurality of synchronized reference clock duty cycles and said synchronized system clock duty cycle, said second comparator to generate said at least a second detection signal based on a comparison of at least a second reference clock duty cycle of said plurality of synchronized reference clock duty cycles to said logic low pulse of said synchronized system clock duty cycle.

18. The system of claim 17 further comprising a processor operatively coupled to said first comparator to receive said of at least a first detection signal, and operatively coupled to said second comparator to receive said at least a second detection signal.

19. The system of claim 17 wherein said clock synchronizer includes a means for synchronously transmitting said logic high pulse of said system clock duty cycle and said at least a first reference clock duty cycle, and for synchronously transmitting said logic high pulse of said system clock duty cycle and said at least a second reference clock duty cycle.

20. The system of claim 17
wherein said first comparator includes a first shift register operatively coupled to said clock synchronizer to receive said plurality of synchronized reference clock duty cycles and to receive said synchronized system clock duty cycle, said first shift register to generate said at least a first detection signal during a reception of said logic high pulse of said synchronized system clock duty cycle by said first shift register, and
wherein said second comparator includes a second shift register operatively coupled to said clock synchronizer to receive said plurality of synchronized reference clock duty cycles and to receive said synchronized system clock duty cycle, said second shift register to generate said at least a second detection signal during a reception of said logic low pulse of said synchronized system clock duty cycle by said second shift register.

21. The system of claim 14 or 17 wherein said pulse width detector further includes a logic unit operatively coupled to said first comparator to receive said at least a first detection signal, said logic unit generating an error signal in response to said at least a first detection signal.

22. The system of claim 21 further comprising a processor operatively coupled to said logic unit to receive said error signal.

23. The system of claim 21 wherein said pulse width detector further includes a reset signal generator operatively coupled to said logic unit to receive said error signal, said reset signal generator generating a reset signal in response to said error signal.

24. The system of claim 23 further comprises a processor operatively coupled to said reset signal generator to receive said reset signal.

25. The system of claim 14 or 17 wherein said pulse width detector further includes a logic unit operatively coupled to said second comparator to receive said at least a second detection signal, said logic unit generating an error signal in response to said at least a second detection signal.

26. The system of claim 25 further comprising a processor operatively coupled to said logic unit to receive said error signal.

27. The system of claim 25 wherein said pulse width detector further includes a reset signal generator operatively coupled to said logic unit to receive said error signal, said reset signal generator generating a reset signal in response to said error signal.

28. The system of claim 27 further comprising a processor operatively coupled to said reset signal generator to receive said reset signal.

29. The system of claim 14 or 17 wherein said pulse width detector further includes a logic unit operatively coupled to aid first comparator to receive said at least a first detection signal and operatively coupled to said second comparator to receive said at least a second detection signal, said logic unit generating an error signal in response to said at least a first detection signal, or in response to said at least a second detection signal.

30. The system of claim 29 further comprising a processor operatively coupled to said logic unit to receive said error signal.

31. The system of claim 28 wherein said pulse width detector further includes a reset signal generator operatively coupled to said logic unit to receive a said error signal, said reset signal generator generating a reset signal in response to said error signal.

32. The system of claim 31 further comprising a processor operatively coupled to said reset signal generator to receive said reset signal.

33. A method for monitoring an operating frequency of a system clock duty cycle, the system clock duty cycle including a logic high pulse having a first time interval and a logic low pulse having a second time interval, said method comprising:

(a) a step of generating a plurality of reference clock duty cycles;

(b) a step of generating at least a first detection signal, in response to an occurrence of a first pulse width violation during the first time interval of the logic high pulse of the system clock duty cycle; and (c) a step of generating a least a second detection signal in response to an occurrence of a second pulse width violation during the second time interval of the logic low pulse of the system clock duty cycle.

34. The method of claim 33 wherein said step (b) includes comparing at least one reference clock duty cycle of said plurality of reference clock duty cycles to the logic high pulse of the system clock duty cycle.

35. The method of claim 33 wherein said step (c) includes comparing at least one reference clock duty cycle of said plurality of reference clock duty cycles to the logic low pulse of the system clock duty cycle.

36. The method of claim 33 further comprising (d) a step of generating an error signal in response to said at least a first detection signal in response to said at least a second detection signal.

37. The method of claim 36 further comprising (e) a step of generating a reset signal in response to said error signal.

* * * * *